(12) United States Patent
Happoya et al.

(10) Patent No.: US 9,155,203 B2
(45) Date of Patent: Oct. 6, 2015

(54) APPARATUS FOR MANUFACTURING FLEXIBLE PRINTED WIRING BOARD, APPARATUS FOR MANUFACTURING WIRING BOARD, AND APPLYING DEVICE

(75) Inventors: Akihiko Happoya, Tokyo (JP); Yasuki Torigoshi, Tokyo (JP); Sadahiro Tamai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 13/463,580

(22) Filed: May 3, 2012

(65) Prior Publication Data

US 2013/0081568 A1 Apr. 4, 2013

(30) Foreign Application Priority Data

Sep. 30, 2011 (JP) ................. 2011-218615

(51) Int. Cl.
| | |
|---|---|
| *B05B 7/06* | (2006.01) |
| *B05C 13/02* | (2006.01) |
| *H01L 21/4763* | (2006.01) |
| *H05K 3/02* | (2006.01) |
| *H05K 3/40* | (2006.01) |
| *H05K 1/18* | (2006.01) |
| *H05K 3/28* | (2006.01) |

(52) U.S. Cl.
CPC .............. *H05K 3/022* (2013.01); *H05K 3/4069* (2013.01); *H05K 1/189* (2013.01); *H05K 3/281* (2013.01); *H05K 2201/0191* (2013.01)

(58) Field of Classification Search
USPC .............. 118/313–315, 58, 66; 438/618, 620, 438/622; 174/264–265; 427/66, 372.2
See application file for complete search history.

(56) References Cited

U.S. PATENT DOCUMENTS

| | | |
|---|---|---|
| 5,440,075 A | 8/1995 | Kawakita et al. |
| 5,457,881 A | 10/1995 | Schmidt |
| 5,480,839 A | 1/1996 | Ezawa et al. |

(Continued)

FOREIGN PATENT DOCUMENTS

| | | |
|---|---|---|
| JP | 06-104545 | 4/1994 |
| JP | 06-216258 | 8/1994 |

(Continued)

OTHER PUBLICATIONS

Japanese Patent Application No. 2011-218615, Decision to Grant a Patent, mailed Oct. 23, 2012, (with English Translation).

(Continued)

*Primary Examiner* — Yewebdar Tadesse
(74) *Attorney, Agent, or Firm* — Blakely Sokoloff Taylor and Zafman LLP

(57) ABSTRACT

According to one embodiment, an apparatus includes: a device configured to partially provide a second conductor layer on a surface of a first conductor layer; a device configured to partially provide a first insulating layer on the surface of the first conductor layer; a device configured to integrate the first conductor layer, the second conductor layer, the first insulating layer, and a third conductor layer, in a state in which the second conductor layer and the first insulating layer provided on the surface of the first conductor layer are covered with the third conductor layer from a side opposite the first conductor layer; a device configured to form a conductor pattern by partially removing at least one of the first conductor layer and the third conductor layer in a structure obtained by the integrating; and a device configured to cover both sides of the structure.

8 Claims, 16 Drawing Sheets

(56) References Cited

U.S. PATENT DOCUMENTS

| | | | |
|---|---|---|---|
| 5,600,103 A * | 2/1997 | Odaira et al. | 174/265 |
| 6,818,820 B2 | 11/2004 | Matsushita et al. | |
| 7,713,862 B2 * | 5/2010 | Cho et al. | 438/622 |
| 7,765,686 B2 | 8/2010 | Murakami et al. | |
| 8,742,264 B2 | 6/2014 | Happoya et al. | |
| 2007/0128855 A1 | 6/2007 | Cho et al. | |
| 2007/0223935 A1 * | 9/2007 | Asai et al. | 398/164 |
| 2008/0111481 A1 * | 5/2008 | Seo et al. | 313/504 |
| 2008/0118681 A1 | 5/2008 | Ueno | |
| 2008/0260938 A1 * | 10/2008 | Ikeda et al. | 427/66 |
| 2009/0233006 A1 * | 9/2009 | Yamazaki et al. | 427/554 |

FOREIGN PATENT DOCUMENTS

| | | |
|---|---|---|
| JP | 2001-160668 | 6/2001 |
| JP | 2001-244607 | 9/2001 |
| JP | 2002-368347 | 12/2002 |
| JP | 2004-55980 | 2/2004 |
| JP | 2007-158352 | 6/2007 |
| JP | 2008-016643 | 1/2008 |
| JP | 2008-130764 | 6/2008 |
| JP | 2011-035372 | 2/2011 |
| JP | 2011-061243 | 3/2011 |
| KR | 20100130682 | 12/2010 |
| TW | 201002168 | 1/2010 |

OTHER PUBLICATIONS

Japanese Patent Application No. 2011-218615, Notice of Rejection, mailed Jul. 17, 2012, (with English Translation).

Combined Office Action and Search Report received in Chinese Patent Application No. 201210244200.2, mailed Oct. 30, 2014, with English Translation of Office Action.

Office Action dated Jun. 16, 2015 for Taiwan patent application 10117423.

Office Action issued Jul. 1, 2015 for Chinese Patent Application No. 201210244200.2.

* cited by examiner

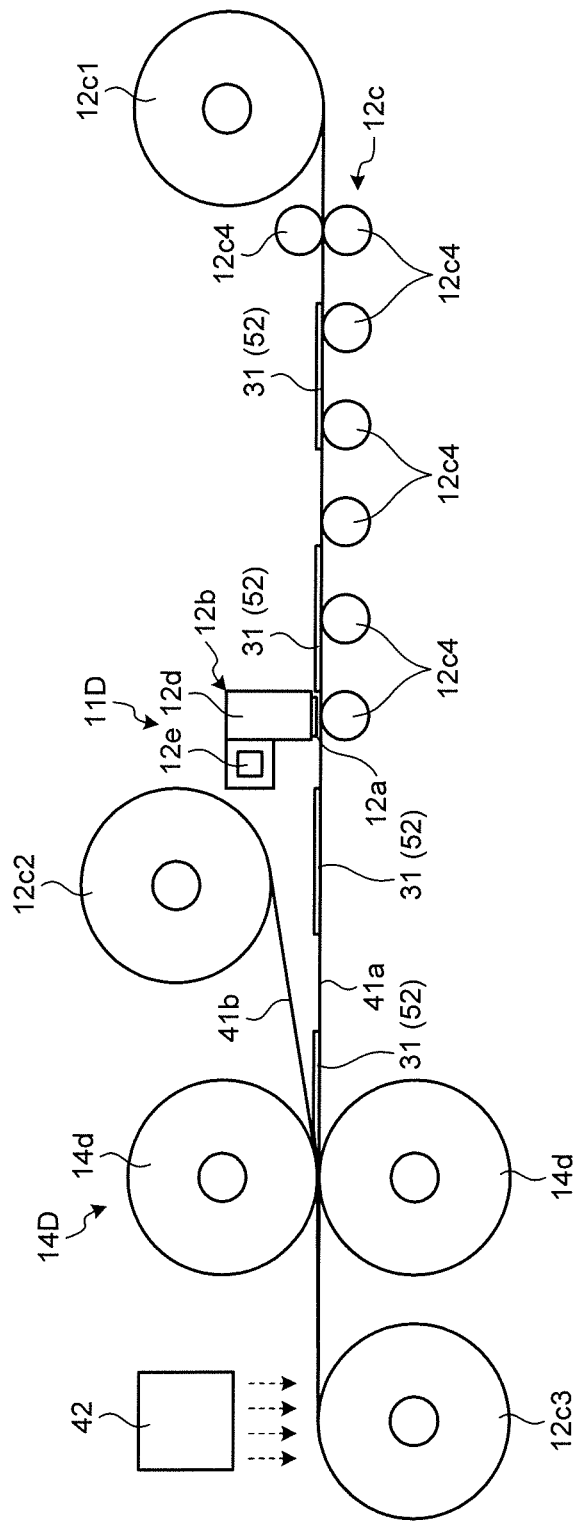

APPARATUS FOR MANUFACTURING FLEXIBLE PRINTED WIRING BOARD, APPARATUS FOR MANUFACTURING WIRING BOARD, AND APPLYING DEVICE

CROSS-REFERENCE TO RELATED APPLICATIONS

This application is based upon and claims the benefit of priority from Japanese Patent Application No. 2011-218615, filed on Sep. 30, 2011, the entire contents of which are incorporated herein by reference.

FIELD

Embodiments described herein relate generally to an apparatus for manufacturing a flexible printed wiring board, an apparatus for manufacturing a wiring board, and an applying device.

BACKGROUND

Conventionally, there has been known a flexible printed wiring board in which conductor patterns are formed on both sides of a base layer (inner layer) constituted of an insulator, and each conductor pattern is covered with an outer layer constituted of an insulator.

In manufacturing a wiring board such as the flexible printed wiring board, a manufacturing apparatus capable of easily manufacturing the wiring board having less inconvenience has been desired.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 25 is an exemplary side view schematically illustrating a general configuration of an ink jet printing device and a pressing device that are comprised in the apparatus for manufacturing the wiring board, in the eighth embodiment.

DETAILED DESCRIPTION

In general, according to one embodiment, an apparatus for manufacturing a flexible printed wiring board, comprises: a device configured to partially provide a second conductor layer on a surface of a first conductor layer; a device configured to partially provide a first insulating layer on the surface of the first conductor layer; a device configured to integrate the first conductor layer, the second conductor layer, the first insulating layer, and a third conductor layer, in a state in which the second conductor layer and the first insulating layer provided on the surface of the first conductor layer are covered with the third conductor layer from a side opposite the first conductor layer; a device configured to form a conductor pattern by partially removing at least one of the first conductor layer and the third conductor layer in a structure obtained by integrating the first conductor layer, the second conductor layer, the first insulating layer, and the third conductor layer; and a device configured to cover both sides of the structure in which the conductor pattern is formed with second insulating layers.

In a plurality of embodiments described below, constitutional elements having identical functions are comprised. Therefore, hereinafter, the constitutional elements having identical functions are given same numerals and their repeated explanation is omitted.

Figure 1:
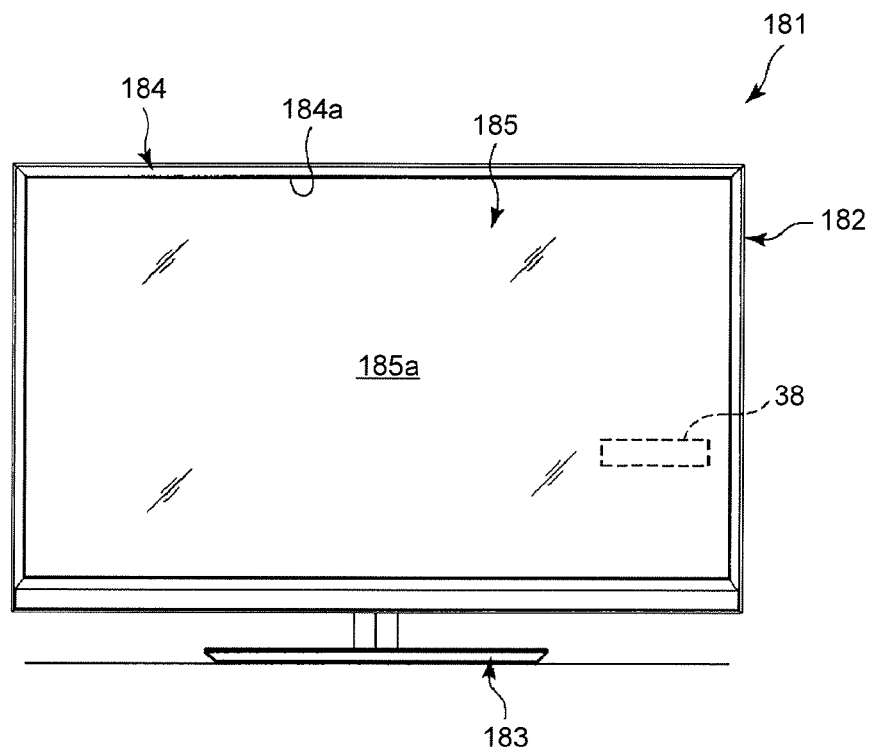
FIG. 1 is an exemplary front view of a television receiver according to a first embodiment.

FIG. 1 illustrates a television receiver 181 according to a first embodiment. The television receiver 181 is one example of "electronic device". The television receiver 181 comprises a body 182 and a stand 183 that supports the body 182. The body 182 comprises a casing 184 and a display device 185 housed in the casing 184. The display device 185 comprises a display screen 185a that displays images. The casing 184 comprises an opening 184a that exposes the display screen 185a.

As illustrated in FIG. 1, the casing 184 houses therein a flexible printed wiring board 38. Here, the casing 184 may house the flexible printed wiring board 38 according to a second embodiment or a third embodiment described below in place of the flexible printed wiring board 38 in the present embodiment.

Hereinafter, the flexible printed wiring board 38 is explained in detail.

FIG. 2 to FIG. 6 disclose the flexible printed wiring board 38 according to the first embodiment. The flexible printed wiring board 38 has pliability (flexibility) and, for example, it is possible to deform (bend) the flexible printed wiring board 38 by relatively large amounts. Here, "flexible printed wiring board" mentioned in the embodiments is not limited to a flexible printed wiring board capable of being bent to the large angle in excess of 90°, and comprises a flexible printed wiring board capable of being bent to the small angle (5° or more, for example).

Figure 2:
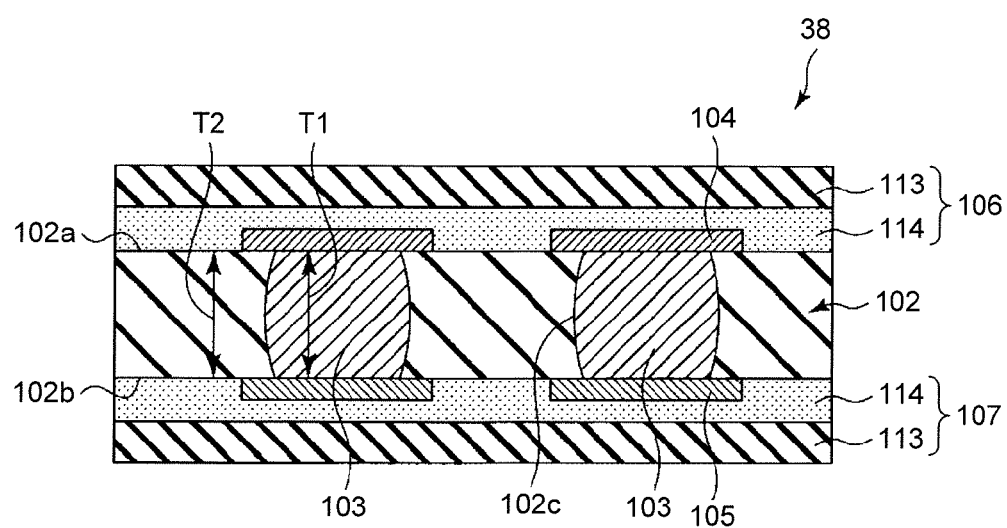
FIG. 2 is an exemplary cross sectional view schematically illustrating a printed wiring board in the first embodiment.

FIG. 2 schematically illustrates one example of the configuration of the flexible printed wiring board 38. The flexible printed wiring board 38 comprises an insulating layer 102, vias 103, a first conductor pattern 104, a second conductor pattern 105, a first coverlay 106, and a second coverlay 107.

The insulating layer 102 is, for example, referred to as a base material or a base film that constitutes a film-like insulator (insulating layer). The insulating layer 102 is constituted of an insulation material 111 (see FIG. 3 and FIG. 4) with pliability (flexibility) after curing. The insulating layer 102 is formed by curing the insulation material 111 (insulating resin) such as thermosetting resin or thermoplastic resin.

The insulation material 111 according to the present embodiment has, for example, characteristics (viscosity or hardness) so as to be capable of being applied in the screen printing or the ink jet printing. The insulation material 111 is, for example, fusible and can be changed into a liquid form (ink-like form).

As a specific example of the insulation material 111 in the present embodiment, any one of elementary substances such as epoxy resin, polyimide resin, polyamide resin, poly-ethylene terephthalate resin, liquid crystal polymer resin, silicon resin, polyurethane resin, and fluorine resin, or a mixture obtained by combining some of the above-mentioned substances are named. Here, the insulation material 111 is not limited to the above-mentioned examples.

As illustrated in FIG. 2, the insulating layer 102 comprises a first surface 102a and a second surface 102b positioned on a side opposite the first surface 102a. In the insulating layer 102, holes 102c that extend between the first surface 102a and the second surface 102b are provided. That is, the holes 102c penetrate between the first surface 102a and the second surface 102b.

Each of the vias 103 is positioned in the hole 102c of the insulating layer 102. The each of the vias 103 extends between the first surface 102a and the second surface 102b of the insulating layer 102. A thickness T1 of the via 103 is substantially the same as a thickness T2 of the insulating layer 102. The via 103 is, for example, provided by curing electrically conductive paste 112 (see FIG. 3 and FIG. 4).

The electrically conductive paste 112 is, for example, conductive paste or soldering paste (solder-based paste). One example of the "conductive paste" is a mixture obtained by mixing conductive powder with the thermosetting resin (or the thermoplastic resin); for example, copper paste, silver paste, or a mixture obtained by mixing the copper paste with the silver paste are named. Furthermore, as the "conductive paste", nanopaste such as copper nanopaste or silver nanopaste may be used. One example of the "solder paste" is a mixture obtained by mixing fine particles of solder alloy with flux.

The electrically conductive paste 112 in the present embodiment has characteristics (viscosity or hardness) capable of being applied in the screen printing or the ink jet printing. Here, the electrically conductive paste 112 is not limited to the above-mentioned examples.

As illustrated in FIG. 2, the first conductor pattern 104 (first conductor layer) is provided on the first surface 102a of the insulating layer 102. The first conductor pattern 104 is connected (joined) to the via 103 and electrically connected to the via 103. The second conductor pattern 105 (second conductor layer) is provided on the second surface 102b of the insulating layer 102. The second conductor pattern 105 is connected (joined) to the via 103 and electrically connected to the via 103. That is, the via 103 electrically connects the first conductor pattern 104 to the second conductor pattern 105.

Each of the first conductor pattern 104 and the second conductor pattern 105 is, for example, a wiring pattern (signal layer). Here, either one of the first conductor pattern 104 or the second conductor pattern 105 may be a solid layer that constitutes a power source layer or a ground layer.

The flexible printed wiring board 38 is, for example, constituted of a so-called two-layer material that is formed by stacking the first conductor pattern 104 or the second conductor pattern 105 directly on the insulating layer 102.

As illustrated in FIG. 2, the first coverlay 106 (first cover layer) is stacked on the first conductor pattern 104, and the second coverlay 107 (second cover layer) is stacked on the second conductor pattern 105. Each of the first coverlay 106 and the second coverlay 107 constitutes an insulator (insulating layer) for protection, and is exposed to the outside of the flexible printed wiring board 38.

As illustrated in FIG. 2, each of the first coverlay 106 and the second coverlay 107 comprises, for example: a surface layer 113; and an adhesive layer 114 (adhesive agent) positioned between the surface layer 113 and the insulating layer 102. The surface layer 113 is, for example, constituted of an insulation resin such as a polyimide resin or a polyethylene terephthalate resin.

Figure 3:
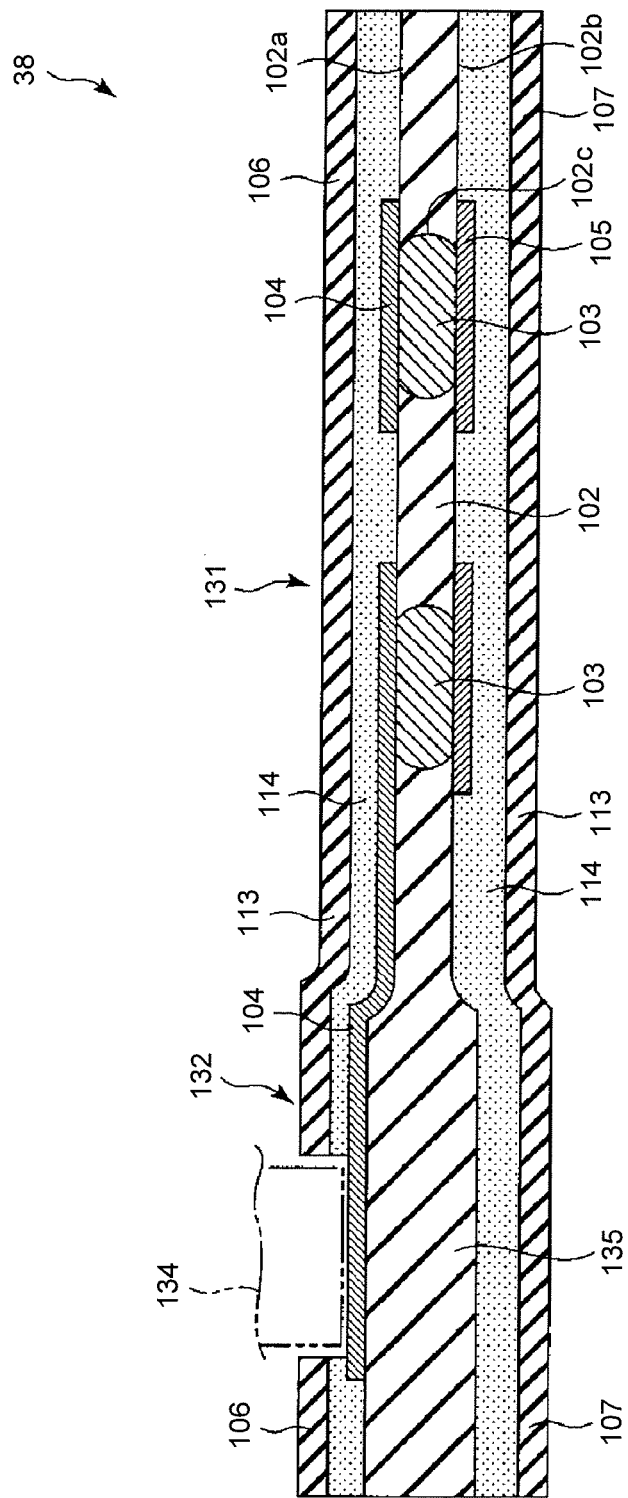
FIG. 3 is an exemplary cross sectional view schematically illustrating a printed wiring board according to a second embodiment.

FIG. 3 illustrates a flexible printed wiring board 38 according to a second embodiment. The flexible printed wiring board 38 in the present embodiment partially differs in thickness. One example of the flexible printed wiring board 38 comprises a first part 131 and a second part 132 with a thickness larger than that of the first part 131.

The first part 131 is an area on which parts (electronic components) are not mounted and the area is given priority to the characteristic of being flexibly deformed (bent). The first part 131 has a configuration substantially the same as that of the flexible printed wiring board 38 in the above-mentioned first embodiment. That is, the first part 131 comprises a first insulating layer 102, the vias 103, the first conductor pattern 104, the second conductor pattern 105, the first coverlay 106, and the second coverlay 107.

The second part 132 is an area on which parts 134 (electronic components) are mounted and the area is hardly deformed (bent) compared to the first part 131. The second part 132 comprises a second insulating layer 135, the first conductor pattern 104, the second conductor pattern 105 (not illustrated in the drawings), the first coverlay 106, and the second coverlay 107. The second insulating layer 135 is a part corresponding to the first insulating layer 102 and positioned between the first conductor pattern 104 and the second conductor pattern 105. The second insulating layer 135 is large in thickness compared to the first insulating layer 102.

The second insulating layer 135 is formed while changing the thickness of the insulation material 111 applied compared to the first insulating layer 102. The thickness of the insulation material 111 can partially be, for example, varied by applying the insulation material 111 in the ink jet printing. Due to such configuration, it is possible to improve the stability of component mounting and the reliability of the flexible printed wiring board 38.

Here, in one example illustrated in FIG. 3, the second part 132 comprises no vias 103. However, the embodiment is not limited to this example. The second part 132 may comprise the vias 103. Here, in this case, the vias 103 of the second part 132 are formed while changing the thickness of the electrically conductive paste 112 applied compared to the vias 103 of the first part 131.

Figure 4:
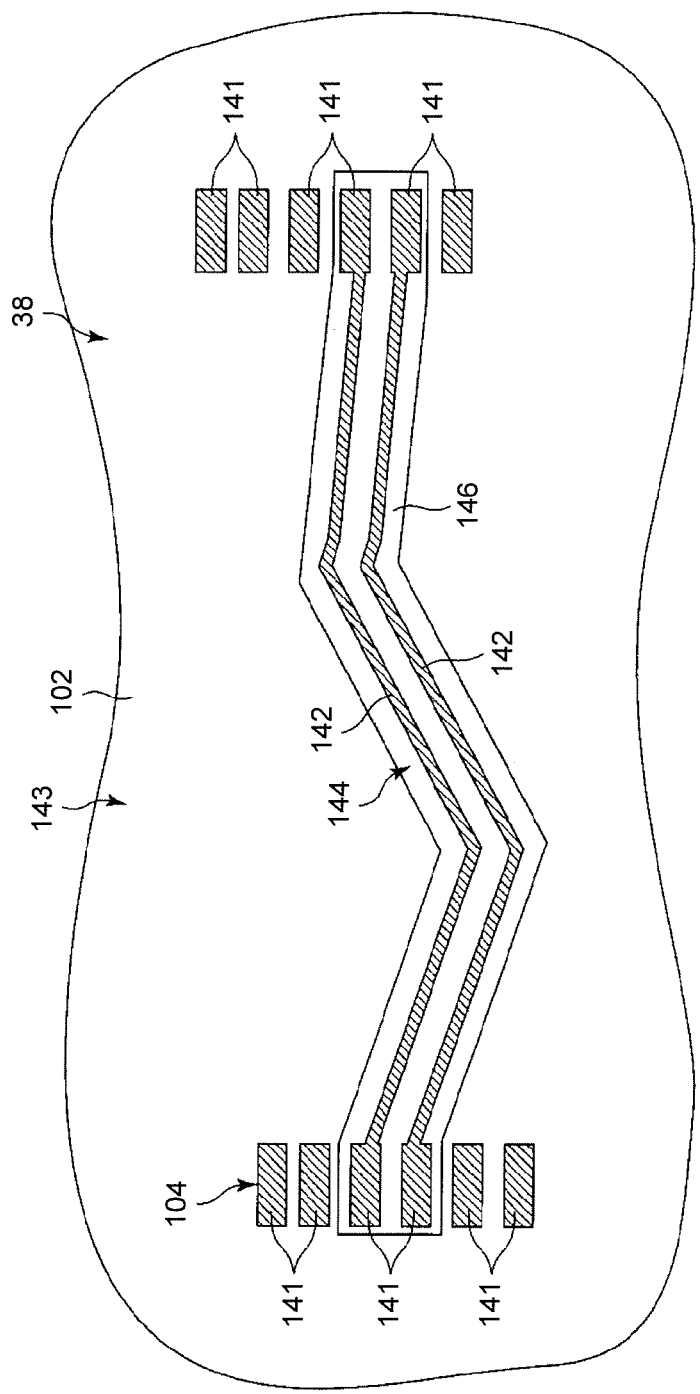
FIG. 4 is an exemplary plan view schematically illustrating a printed wiring board according to a third embodiment.

FIG. 4 illustrates the flexible printed wiring board 38 according to a third embodiment. Here, in FIG. 4, for the sake of convenience in the explanation made hereinafter, areas of the first conductor patterns 104 are hatched. The flexible printed wiring board 38 in the present embodiment comprises insulating layers constituted of insulation materials partially different from each other. As illustrated in FIG. 4, the first conductor pattern 104 (or the second conductor pattern 105) comprises pads 141 and signal lines 142 that connect between the pads 141. The signal lines 142 are, for example, lines used for high-speed transmission (differential wiring, for example).

The flexible printed wiring board 38 in the present embodiment comprises a first part 143 and a second part 144. The first part 143 is, for example, an area in which the signal lines 142 are not formed. The first part 143 comprises a configuration substantially the same as that of the flexible printed wiring board 38 in the above-mentioned first embodiment. That is, the first part 143 comprises the first insulating layer 102, the vias 103, the first conductor pattern 104, the second conductor pattern 105, the first coverlay 106, and the second coverlay 107.

The second part 144 is an area corresponding to the signal lines 142. That is, the second part 144 is the area in which the signal lines 142 are provided. The second part 144 is, for example, the area positioned directly below the signal lines 142. The second part 144 comprises a second insulating layer 146, the first conductor pattern 104, the second conductor pattern 105, the first coverlay 106, and the second coverlay 107. The second insulating layer 146 is a part corresponding to the first insulating layer 102 and positioned between the first conductor pattern 104 and the second conductor pattern 105. The second insulating layer 146 is constituted of the insulation material Indifferent from the insulation material of the first insulating layer 102.

Here, in transmitting a signal in the printed wiring board, the higher the frequency of the signal is, the larger the transmission loss becomes. Therefore, the transmission performance is degraded along with the attenuation of the signal. The transmission loss is resulted from a sum of a conductor loss generated in a conductor in which the signal is transmitted, a dielectric loss generated by bringing the printed wiring board into contact with a dielectric body, and a radiation loss generated in a flexural portion or an end portion of the wiring or the like. The dielectric loss is attributed to a dielectric constant, a dielectric dissipation factor, or the like. Accordingly, when the printed wiring board is constituted of a material having a low dielectric constant and a low dielectric dissipation factor, the transmission loss is decreased.

However, the material with the low dielectric constant and the low dielectric dissipation factor is generally expensive. Accordingly, when the entire printed wiring board is constituted of the material with the low dielectric constant and the low dielectric dissipation factor, the manufacturing cost is increased.

Here, the second insulating layer 146 is formed while changing the thickness of the insulation material 111 applied compared to the first insulating layer 102. The thickness of the insulation material 111 can partially be, for example, varied by applying the insulation material 111 in the ink jet printing.

To be more specific, as the insulation material 111 of the second insulating layer 146, a material with the dielectric constant and the dielectric dissipation factor lower than those of the insulation material 111 of the first insulating layer 102 is used. One example of the insulation material 111 of the second insulating layer 146 contains many fillers. On the other hand, as the insulation material 111 of the first insulating layer 102, a common material is used. Due to such configuration, it is possible to suppress the transmission loss while reducing a cost for manufacturing the flexible printed wiring board 38.

Here, the insulation material 111 containing many fillers has the higher hardness compared to the insulation material 111 containing a few fillers. Accordingly, as described in the second embodiment, in the flexible printed wiring board 38 comprising the first part 131 that is given priority to the flexibility and the second part 132 that is the area for mounting the parts, the insulation materials 111 of the first part 131 and the second part 132 may differ from each other. For example, as the insulation material 111 of the first part 131, the common material is used. As the insulation material 111 of the second part 132, the material containing many fillers compared to the insulation material 111 of the first part 131 is used. Due to such configuration, it is possible to improve the stability of the component mounting and the reliability of the flexible printed wiring board 38.

Figure 5:
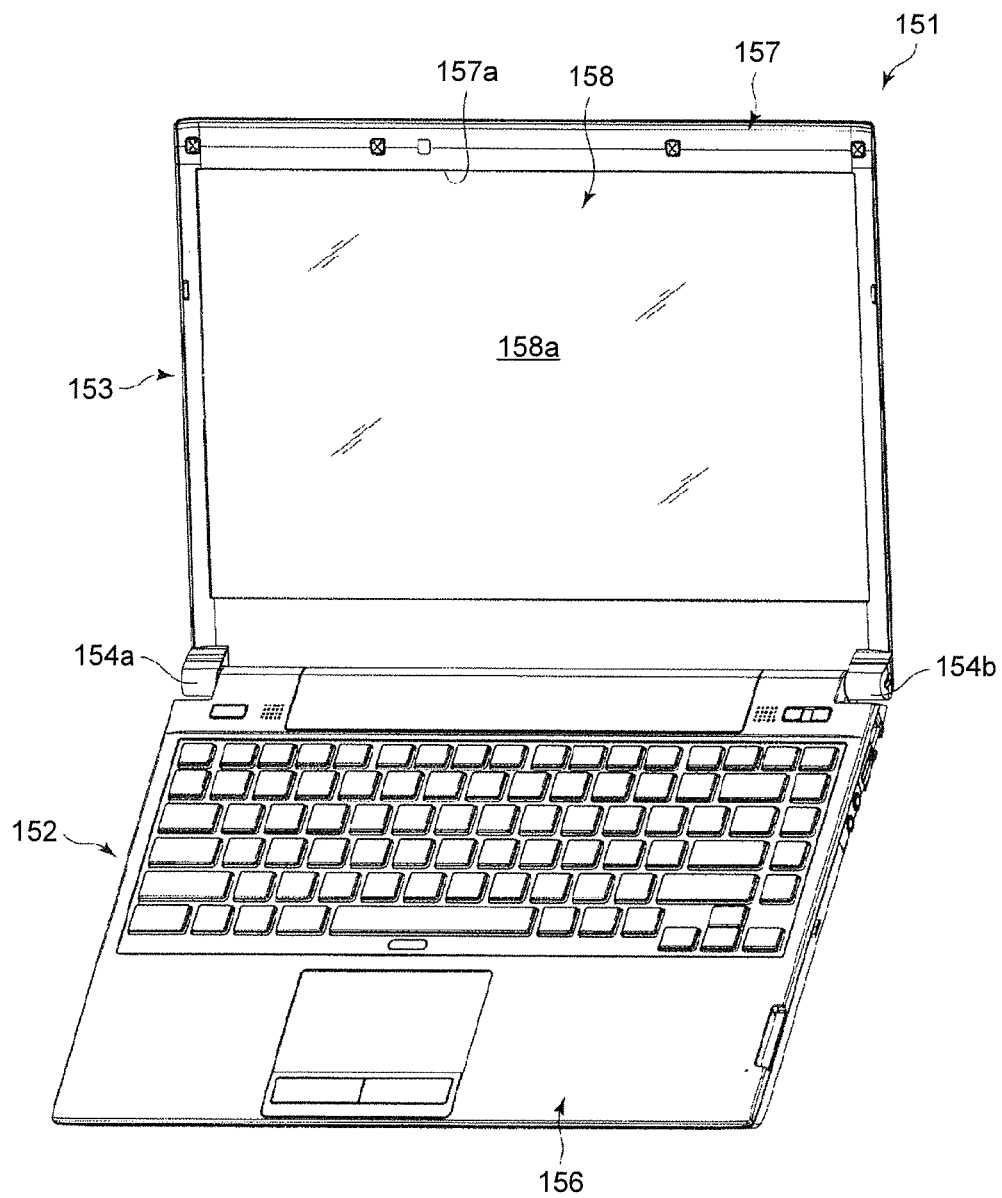
FIG. 5 is an exemplary perspective view of an electronic device according to a fourth embodiment.

FIG. 5 illustrates an electronic device 151 according to a fourth embodiment. The electronic device 151 is, for example, a notebook-type portable computer (notebook PC). Here, the electronic device to which the present embodiment is applicable is not limited to the above-mentioned example. The present embodiment is extensively applicable to various types of the electronic device such as a television receiver, a tablet terminal, a slate-type portable computer (slate PC), a mobile phone, a smart phone, a digital book terminal, or a game machine.

As illustrated in FIG. 5, the electronic device 151 has a first unit 152, a second unit 153, and hinges 154a and 154b. The first unit 152 is, for example, an electronic device body. The first unit 152 comprises a first casing 156.

The second unit 153 is, for example, a display module, and comprises a second casing 157 and a display device 158 housed in the second casing 157. The display device 158 is, for example, a liquid crystal display. However, the display device 158 is not limited to the liquid crystal display. The display device 158 comprises a display screen 158a on which images are displayed. The second casing 157 comprises an opening 157a that exposes the display screen 158a to the outside thereof.

The second casing 157 is connected to the posterior end portion of the first casing 156 in a rotatable (openable/closable) manner with the use of the hinge modules 154a and, 154b. Due to such a constitution, the electronic device is configured such that the second unit 153 is rotatable between a first position where the second unit 153 is put on the first unit 152 and a second position where the second unit 153 is disposed in an open state relative to the first unit 152.

Next, the configuration inside the first casing 156 (hereinafter, referred to as merely "casing 156") is explained in detail.

Figure 6:
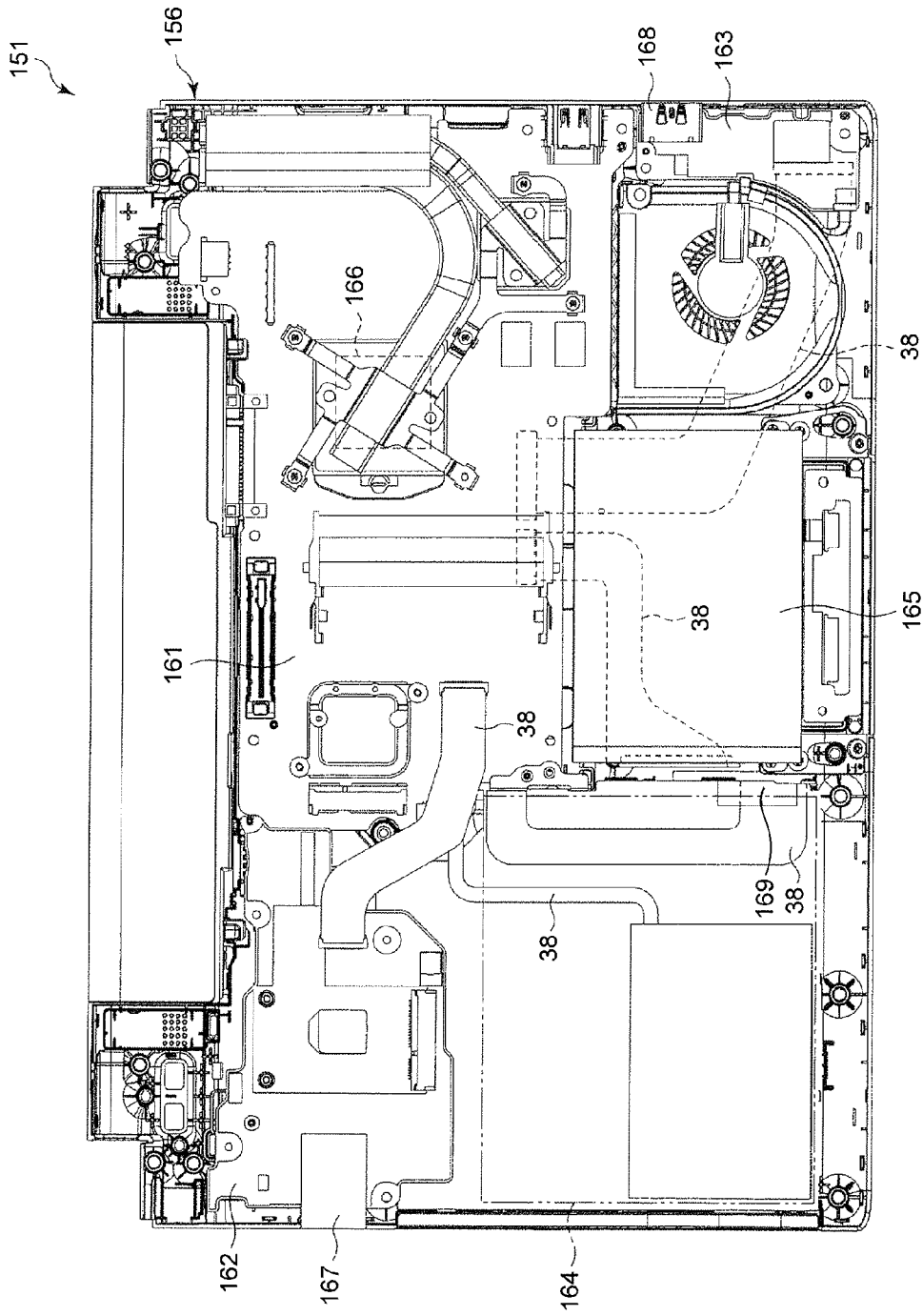
FIG. 6 is an exemplary bottom view of inside the electronic device illustrated in FIG. 5, in the fourth embodiment.

As illustrated in FIG. 6, the casing 156 comprises a first circuit board 161, a second circuit board 162, a third circuit board 163, an optical disk drive (ODD) 164, and a hard disk drive (HDD) 165.

The first circuit board 161 is, for example, a main board on which a central processing unit (CPU) 166 is mounted. The second circuit board 162 is positioned on an end portion of the casing 156 and comprises a first connector 167 mounted thereon. The third circuit board 163 is positioned on another end portion of the casing 156 and comprises a second connector 168 mounted thereon. The first connector 167 and the second connector 168 provide, for example, passages through which signals of high-frequency band (gigahertz-frequency band, for example) flow.

The electronic device 151 further comprises the flexible printed wiring boards 38 that electrically connect between the first circuit board 161 and each of the second circuit board 162, the third circuit board 163, the ODD 164, and the HDD 165. Each flexible printed wiring board 38 corresponds to the flexible printed wiring board in any one of the first embodiment to the third embodiment, which are described above.

Figure 7:
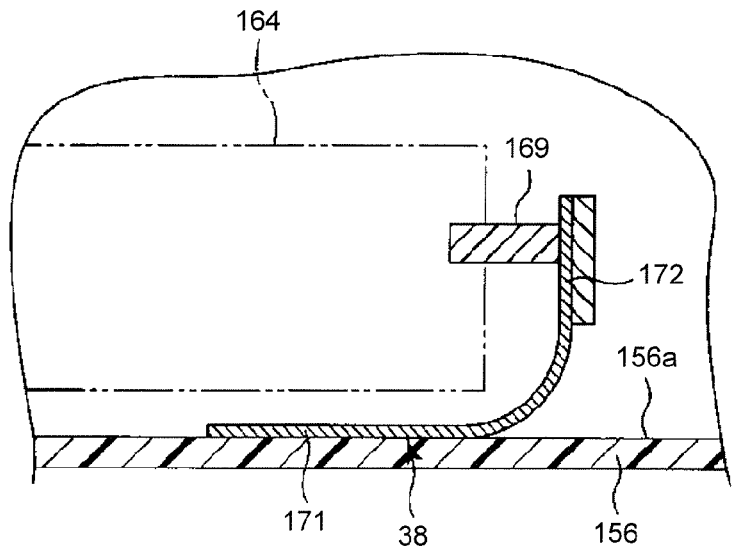
FIG. 7 is an exemplary cross sectional view of a flexible printed wiring board illustrated in FIG. 6, in the fourth embodiment.

FIG. 7 illustrates the flexible printed wiring board 38 that connects between the ODD 164 and the first circuit board 161. The flexible printed wiring board 38 comprises a connector 169 that is mounted thereon and connected to the ODD 164. The connector 169 is one example of "electronic component". The flexible printed wiring board 38 on which the electronic component is mounted is one example of "module".

As illustrated in FIG. 7, the flexible printed wiring board 38 comprises, for example, a first part 171 arranged along an inside surface 156a of the casing 156 and a second part 172 that is bent with respect to the first part 171 and spaced apart from the inside surface 156a of the casing 156.

Due to such configuration, the reduction in thickness and weight of the flexible printed wiring board 38 can achieve the reduction in thickness and weight of the electronic device 151. Furthermore, recently, there exists tendency that the electronic device 151 reduces the thickness thereof by miniaturizing the main board (first circuit board 161). Accordingly, the distance between the first circuit board 161 and the connectors 167, 168 arranged on the side face of the casing 156 is increased and hence, electrical losses are liable to be generated therebetween.

On the other hand, with the constitution of the present embodiment, in the same manner as the case of the above-mentioned first embodiment, it is possible to use the electrically conductive paste 112 with small electric resistivity thus suppressing the electrical losses between the first circuit board 161 and the connectors 167, 168. The use of the electrically conductive paste 112 contributes to the improvement in the performance of the electronic device 151.

Figure 8:
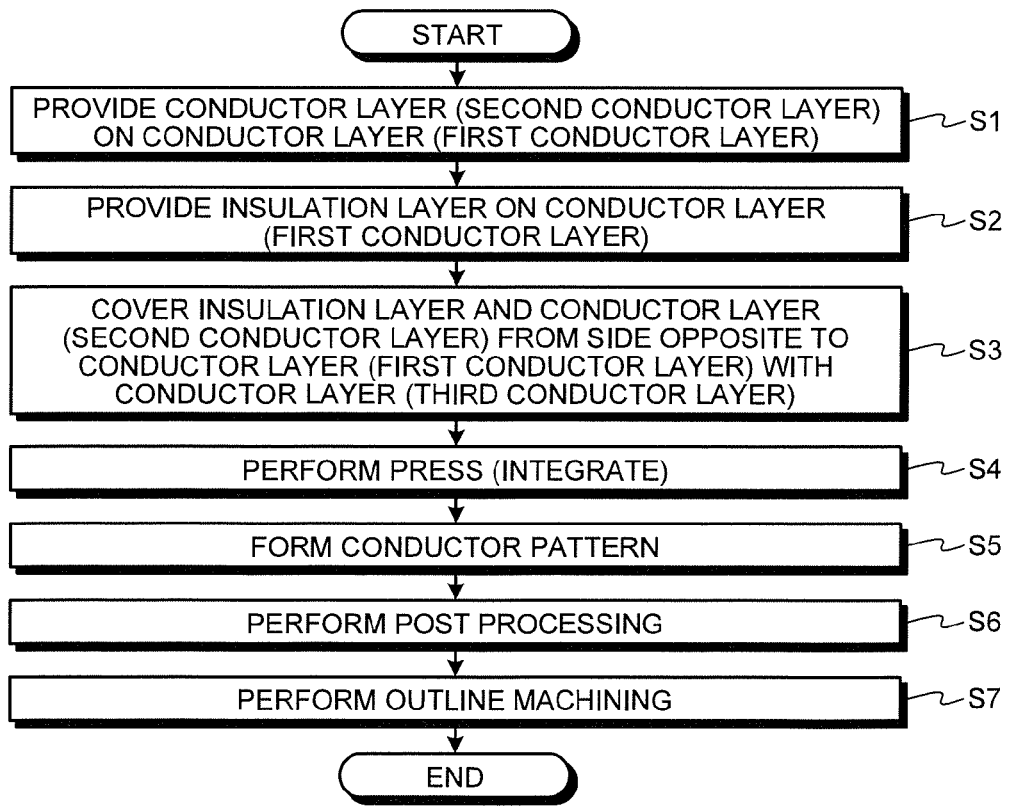
FIG. 8 is an exemplary flowchart of a method for manufacturing a wiring board in one embodiment.
Figure 9:
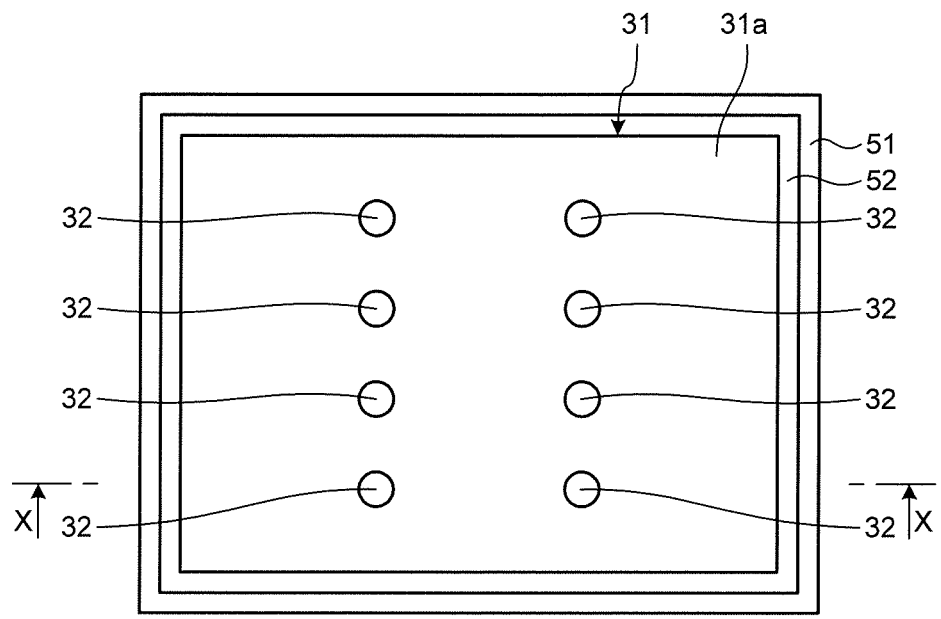
FIG. 9 is an exemplary plan view of a structure of the wiring board manufactured at S1 of the method for manufacturing the wiring board in FIG. 8, in the one embodiment.
Figure 10:
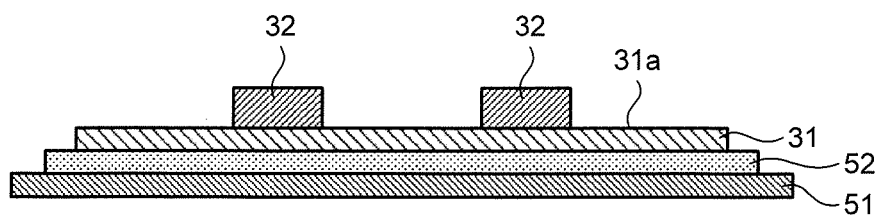
FIG. 10 is an exemplary cross sectional view taken along a line X-X in FIG. 9, in the one embodiment.

First of all, in conjunction with FIGS. 8 to 10, a method for manufacturing the flexible printed wiring board 38 (see FIG. 16) in a fifth embodiment is explained. In the present embodiment, as one example, the flexible printed wiring board 38 is manufactured in accordance with procedures ((processes, acts) S1 to S7) illustrated in FIG. 8.

At S1, as one example, as illustrated in FIGS. 9, 10, conductor layers 32 (second conductor layer) are provided on a surface 31a of a conductor layer 31 (first conductor layer, conductive film). The conductor layer 31 is, for example, made of copper foil. The conductor layer 31 is, as illustrated in FIG. 9 as one example, provided in a quadrangle-film shape (rectangular-film shape, for example).

The conductor layer 31 can be, as illustrated in FIGS. 9, 10 as one example, stacked on a pallet 51 (work, plate, stacking plate, support member, conveyance body, base) and a cushion material 52 (buffer material, elastic body). The pallet 51 and the cushion material 52 are, for example, formed wider than the conductor layer 31 in such a manner that the pallet 51 and the cushion material 52 are protruded outward from the periphery of the conductor layer 31. The pallet 51 is formed in a quadrangle-plate shape (rectangular-plate shape, for example). The cushion material 52 is formed in a quadrangle-sheet shape (rectangular-sheet shape, for example). The cushion material 52 is stacked on the pallet 51. The conductor layer 31 is stacked on the pallet 51 via the cushion material 52. The cushion material 52 is softer than the pallet 51 and has flexibility (pliability, elasticity). At each step in manufacturing the flexible printed wiring board 38, the conductor layer 31, and the respective layers and structures that are provided on the conductor layer 31 can be conveyed while being stacked on the pallet 51 and the cushion material 52, or only on the pallet 51. The pallet 51 functions as the support member that supports the conductor layer 31 being soft and capable of being easily bent, and the respective layers and structures that are formed on the conductor layer 31.

At S1, the conductor layer 32 can be, for example, formed by applying a conductor 32L onto the surface 31a of the conductor layer 31 in a state in which the conductor 32L has fluidity. The conductor 32L is, for example, selectively (partially) applied onto the surface 31a of the conductor layer 31. The application of the conductor 32L can be performed by making use of a printing technique or by applying the printing technique. The conductor 32L is cured (solidified, dried) at a step after S1 (S4 in the present embodiment, for example). Furthermore, the conductor 32L can be cured locally or restrictively in S1. The conductor 32L is, for example, made of electrically conducting paste (in the present embodiment, silver paste, copper paste or the like, for example).

Figure 11:
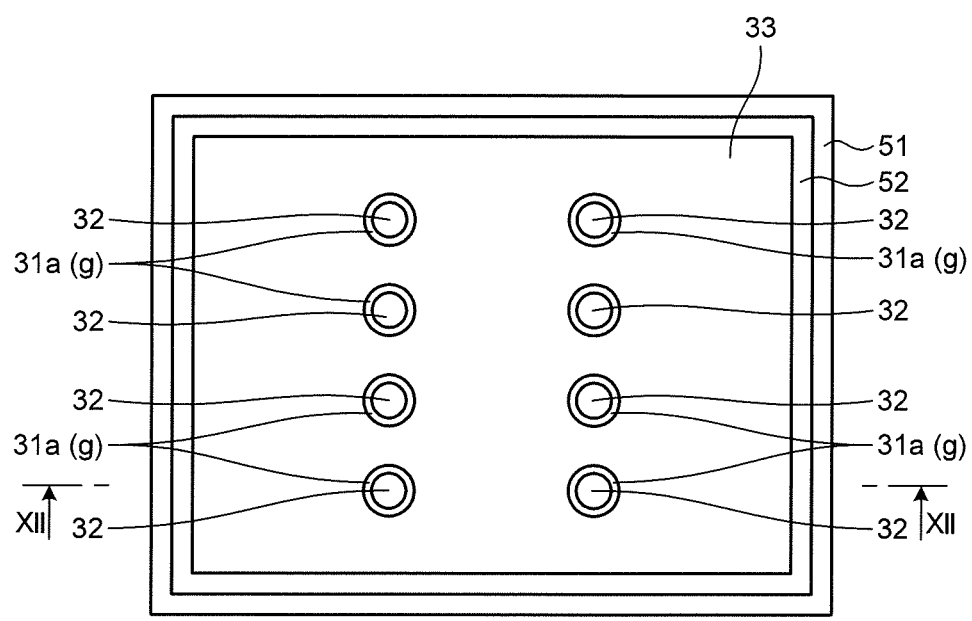
FIG. 11 is an exemplary plan view of the structure of the wiring board manufactured at S2 of the method for manufacturing the wiring board in FIG. 8, in the one embodiment.
Figure 12:
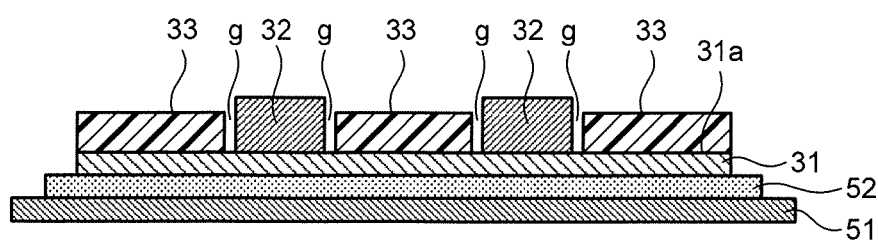
FIG. 12 is an exemplary cross sectional view taken along a line XII-XII in FIG. 11, in the one embodiment.

At S2, as illustrated in FIGS. 11 and 12 as one example, an insulating layer 33 (first insulating layer) is provided on the surface 31a of the conductor layer 31. At S2, the insulating layer 33 is, for example, formed by applying an insulator 33L onto the surface 31a of the conductor layer 31 in a state in which the insulator 33L has fluidity. The insulator 33L is, for example, selectively (partially) applied onto the surface 31a of the conductor layer 31. In this case, the insulator 33L is applied onto a part (area) off from a part onto which the conductor 32L is applied (part (area) on which the conductor layer 32 is provided) so that (the insulator 33L does not contact the conductor 32L and) the insulator 33L is next to the conductor 32L (conductor layer 32). The insulator 33L is cured (solidified, dried) in a stage after S1 (S4 in the present embodiment, for example). Furthermore, the insulator 33L can be cured locally or restrictively at S2. The insulator 33L is, for example, made of a thermosetting synthetic-resin material (polyimide or the like in the present embodiment, for example).

It is possible to perform S1 and S2 concurrently. Furthermore, one of S1 and S2 can be performed first, and the other step can be performed next. When S1 is performed prior to S2, the insulating layer 33 is hardly interposed into a contact portion (connection portion) between the conductor layer 31 and the conductor layer 32. Furthermore, as one example, when S1 is performed prior to S2, due to the deterioration (oxidation or the like, for example) of the surface 31a of the conductor layer 31, the increase in electric resistance of the connection portion between the conductor layer 31 and the conductor layer 32 or the deterioration in bonding strength between the conductor layer 31 and the conductor layer 32 can easily be suppressed.

Furthermore, at S1 and S2, as one example, as illustrated in FIG. 12, it is possible to form the conductor layer 32 higher than the insulating layer 33 in a protruded manner. In this case, at later S4, the conductor layer 32 and a conductor layer 34 (see FIGS. 13, 14) can securely be electrically connected with each other. Furthermore, at S1 and S2, as one example, as illustrated in FIG. 11, it is possible to provide a gap g between the conductor 32L (conductor layer 32) and the insulator 33L (insulating layer 33). At later S4, the conductor layer 32 or the insulating layer 33 that is deformed by being pressed in the thickness direction (height direction, vertical direction in FIG. 12) enters the gap g. Furthermore, after S1 and S2, a process such that the conductor layer 32 or the insulating layer 33 is partially or restrictively cured (solidified, dried) may be performed.

Figure 13:
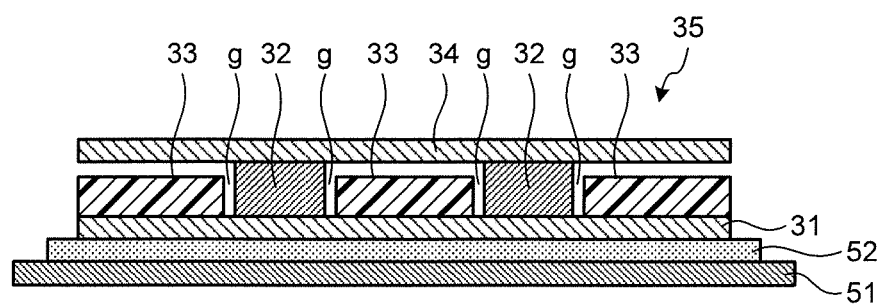
FIG. 13 is an exemplary cross sectional view of the structure of the wiring board manufactured at S3 of the method for manufacturing the wiring board in FIG. 8, in the one embodiment.
Figure 14:
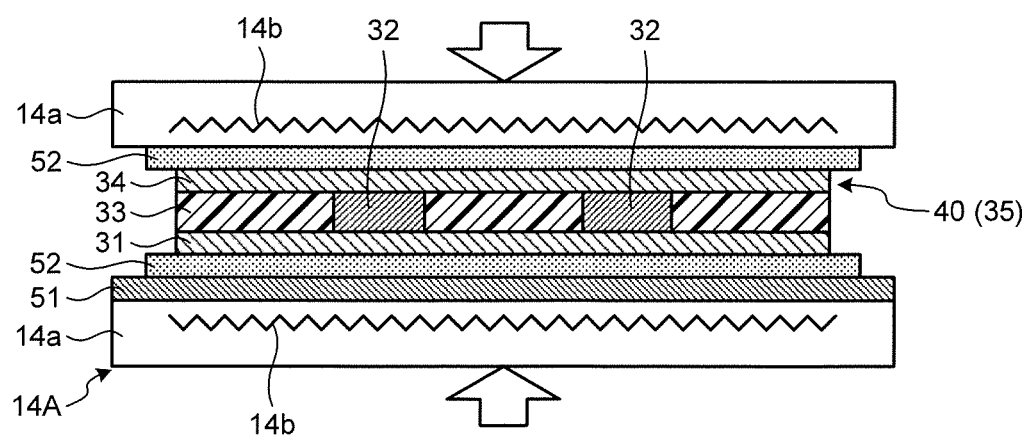
FIG. 14 is an exemplary cross sectional view of the structure of the wiring board manufactured at S4 of the method for manufacturing the wiring board in FIG. 8, in the one embodiment.

At S3, as one example, as illustrated in FIG. 13, one side of the conductor layer 32 and the insulating layer 33 opposite other side thereof covered by the conductor layer 31 is covered with the conductor layer 34 (third conductor layer, conductive film). Furthermore, at S4 performed next, as one example, as illustrated in FIG. 14, the conductor layer 32 and the insulating layer 33 are sandwiched between the conductor layer 31 and the conductor layer 34, and pressed. Here, a structure 35 provided in such a way that the conductor layer 32 and the insulating layer 33 are sandwiched between the conductor layer 31 and the conductor layer 34 is sandwiched between presses 14a (and the pallet 51) by way of the cushion materials 52. At S4, as one example, the structure 35 is pressed and heated in a state illustrated in FIG. 14 and hence, a structure 40 such that the conductor layers 31, 32, and 34 and the insulating layer 33 are integrally formed can be obtained.

Figure 15:
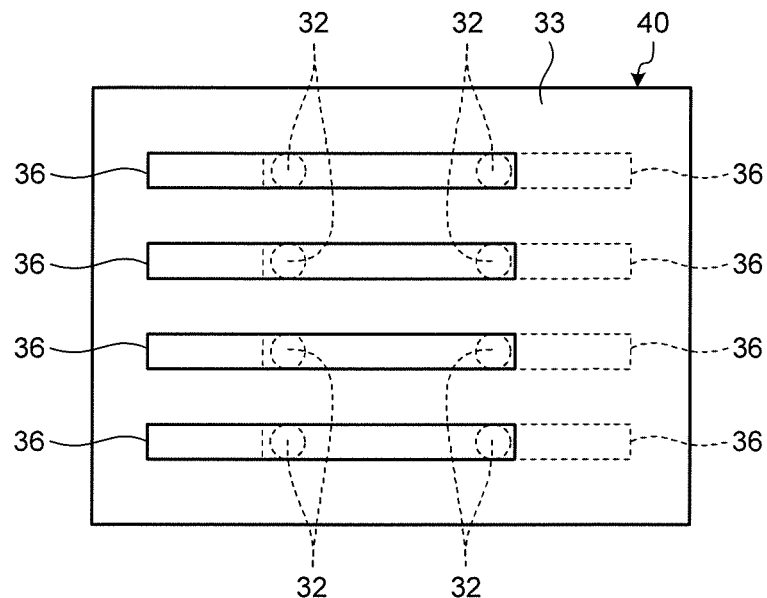
FIG. 15 is an exemplary plan view of the structure of the wiring board manufactured at S5 of the method for manufacturing the wiring board in FIG. 8, in the one embodiment.
Figure 16:
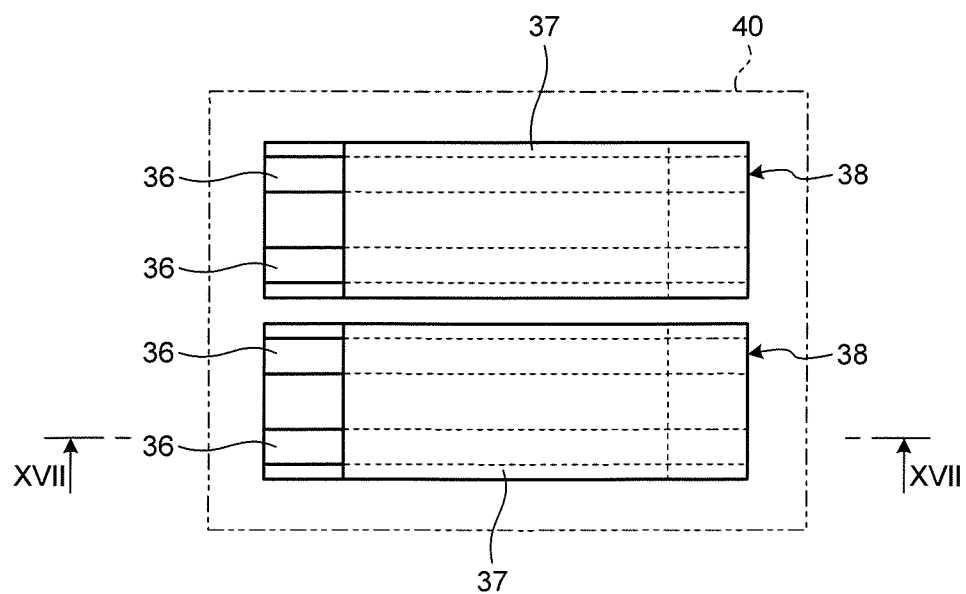
FIG. 16 is an exemplary plan view of the wiring board manufactured by the method for manufacturing the wiring board in FIG. 8, in the one embodiment.
Figure 17:
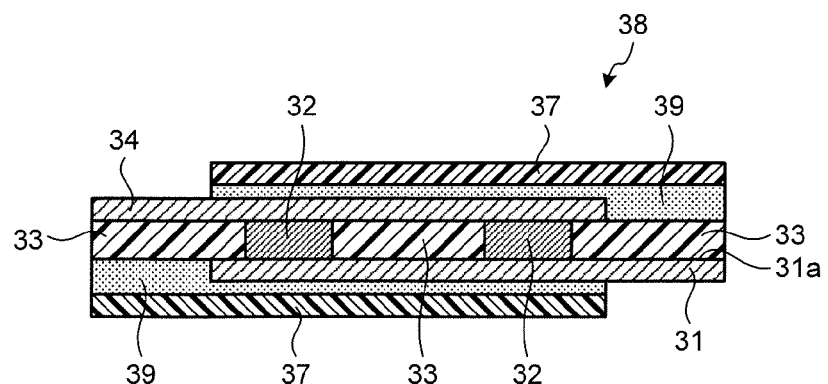
FIG. 17 is an exemplary cross sectional view taken along a line XVII-XVII in FIG. 16, in the one embodiment.

Thereafter, at S5, as one example, at least one of the conductor layer 31 and the conductor layer 34 is partially removed thus forming conductor patterns 36 as illustrated in FIG. 15. At S6 performed next, as one example, the following post processing is performed. That is, for example, processing in which an insulating layer 37 (outer layer, see FIG. 17) with which the conductor layers 31 and 34 are covered is provided, processing in which a reinforcing member (reinforcing plate not illustrated) is provided, and processing in which the surface treatment (application of preflux, plating treatment or the like, for example) for the conductor layer 31 or the conductor layer 34 is performed. Furthermore, at S7, a machining process such as cutting is, for example, performed and hence, as one example, the flexible printed wiring board 38 (wiring board) as illustrated in FIGS. 16, 17 can be obtained. Here, in FIGS. 8 to 10, the comparatively simple constitution of the flexible printed wiring board 38 is illustrated. However, it is needless to say that the flexible printed wiring board 38 having more complicated constitution can be manufactured by the above-mentioned manufacturing method.

By the above-mentioned manufacturing method, in a so-called both-sided board having conductor patterns 36 provided on both sides thereof, it is possible to provide the insulating layer 33, which is to be the base layer (inner layer), on the conductor layer 31 by applying the insulator 33L in a state in which the insulator 33L has fluidity. Therefore, as one example, the control of application of the insulator 33L allows to change the characteristics such as constituents or thicknesses of the insulating layer 33 depending on the place (position) on the conductor layer 31. Accordingly, as one example, the flexible printed wiring board 38 (wiring board) with less inconvenience can easily be obtained. Furthermore, as one example, the characteristics of the insulating layer 33 (base layer) can easily be varied.

Figure 18:
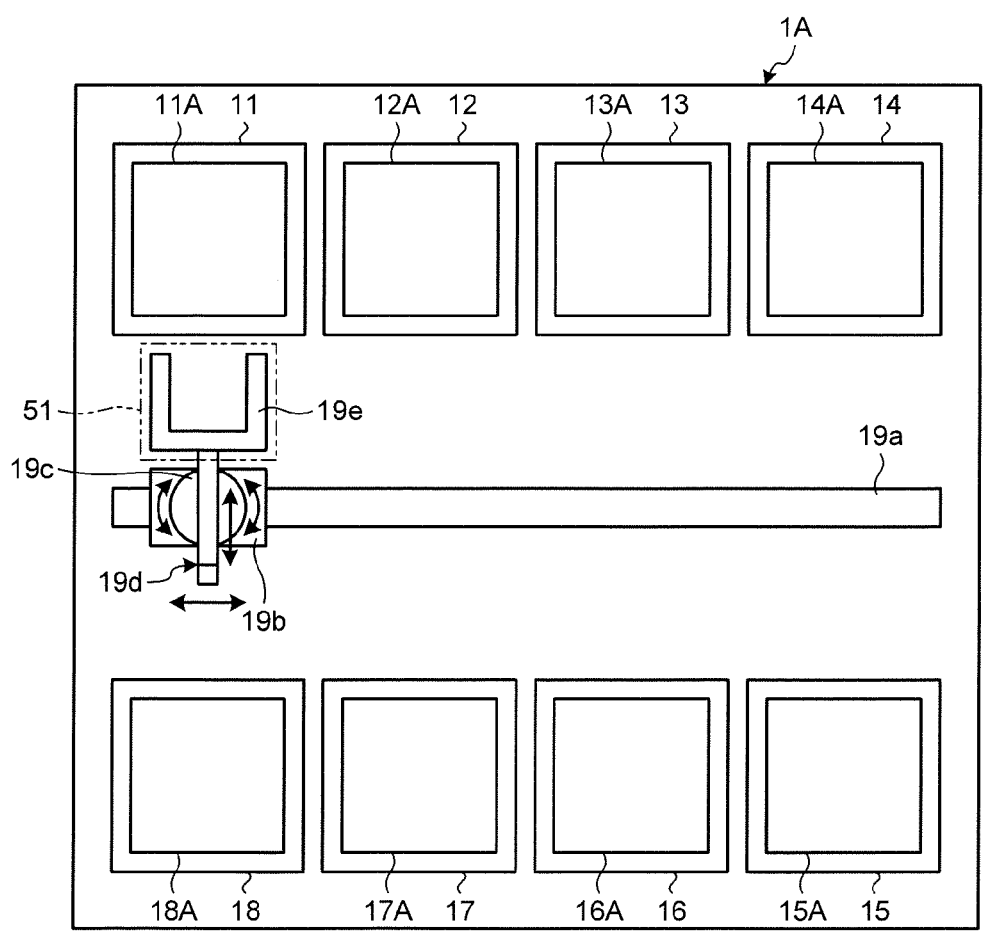
FIG. 18 is an exemplary plan view schematically illustrating a general configuration of an apparatus for manufacturing a wiring board according to a fifth embodiment.

In the present embodiment, as one example, FIG. 18 illustrates a manufacturing apparatus 1A (an apparatus for manufacturing a flexible printed wiring board 38, an apparatus for manufacturing a wiring board), and FIG. 8 illustrates the above-mentioned flow. It is possible to manufacture the flexible printed wiring board 38 with the use of the manufacturing apparatus 1A in accordance with the above-mentioned flow. The manufacturing apparatus 1A (apparatus, facility, or system for manufacturing the flexible printed wiring board 38) comprises a plurality of sections 11 to 18 (in the present embodiment, as one example, eight (8) sections, devices, stages, units, modules, or facilities). To be more specific, for example, in the first section 11, the processing of S1 in FIG. 8 is performed. In the second section 12, the processing of S2 in FIG. 8 is performed. In the third section 13, the processing of S3 in FIG. 8 is performed. In the fourth section 14, the processing of S4 in FIG. 8 is performed. In the fifth section 15, the processing of S5 in FIG. 8 is performed. In the sixth section 16, the processing of forming the reinforcing member, the insulating layer 37 (outer layer) or the like out of the processing of S6 in FIG. 8 is performed. In a seventh section, the surface treatment for exposed portions on the conductor layers 31, 32, and 34 out of the processing of S6 in FIG. 8 is performed. Furthermore, in the eighth section 18, the processing of S7 in FIG. 8 is performed. Furthermore, the manufacturing apparatus 1A comprises a conveyance device 19 for conveying pallets among the sections 11 to 18. Here, categories, layouts (position, direction, order or the like), sizes (width, height, or the like) or the like of the sections 11 to 18 illustrated in FIG. 18 merely constitute one example, and modifications for the manufacturing apparatus 1A are arbitrarily conceivable.

Figure 19:
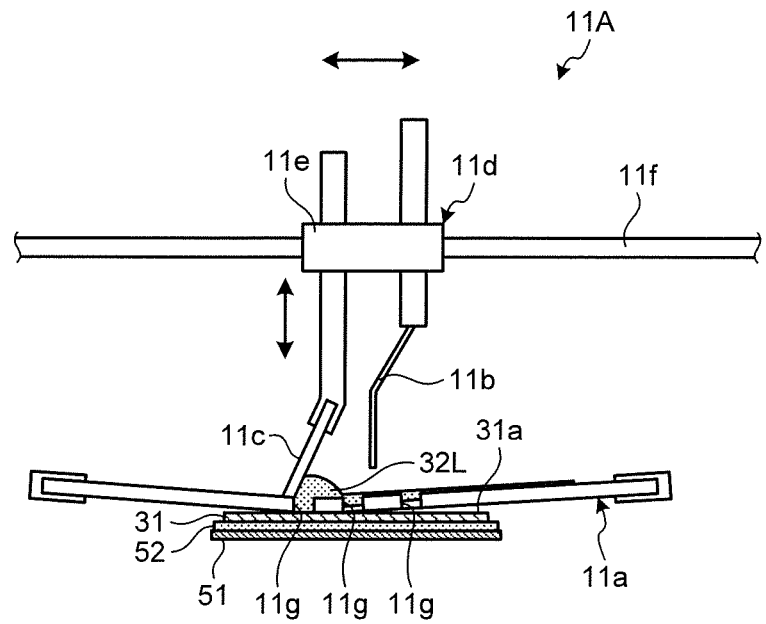
FIG. 19 is an exemplary side view schematically illustrating a general configuration of a part of a screen printing device comprised in the apparatus for manufacturing the wiring board, in the fifth embodiment.

In the present embodiment, as one example, in the first section 11, a screen printing device 11A (application device, film forming device) is provided. The screen printing device 11A comprises, for example, a screen 11a, a nozzle 11b (discharging portion, dispenser), a blade 11c (spatula), a moving device 11d (transfer mechanism), and the like. The nozzle 11b and the blade 11c are attached to a slider 11e of the moving device 11d. The slider 11e can reciprocate along a rail 11f of the moving device 11d in parallel with the surface 31a of the conductor layer 31. Furthermore, the slider 11e is movable between a position close to the surface 31a (position illustrated in FIG. 19) and a position distant from the surface 31a. The screen 11a is provided along the surface 31a at a position spaced apart from the surface 31a. However, the screen 11a is pressed by the blade 11c thus being brought into contact with the surface 31a. The nozzle 11b discharges a medium with fluidity (conductor 32L or the like, ink) to a screen surface side opposite the surface 31a on the screen

11*a*. The distal end portion (edge portion, end portion, peripheral portion) of the blade 11*c* can be moved by the moving device 11*d* along the surface 31*a* and the screen 11*a* (in the lateral direction in the example in FIG. 19) while pressing the screen 11*a* to the surface 31*a*. That is, the blade 11*c* (distal end portion thereof) can rub the medium discharged to a screen surface side opposite the surface 31*a* on the screen 11*a*. The screen 11*a* comprises holes 11*g* formed therein through which the medium passes. In such configuration, the nozzle 11*b* discharges the medium onto the screen 11*a* while being moved by the moving device 11*d*. The distal end portion of the blade 11*c* is moved by the moving device 11*d* along the surface 31*a* while pressing the screen 11*a* to which the medium is discharged to the surface 31*a*. Due to such configuration, the ink is applied to the surface 31*a* passing through the holes fig of the screen 11*a*. The screen printing device 11A applies the medium (conductor 32L or the like, ink) to the surface 31*a* in the pattern corresponding to the holes 11*g* pattern (position, size, layout, or the like).

Figure 20:
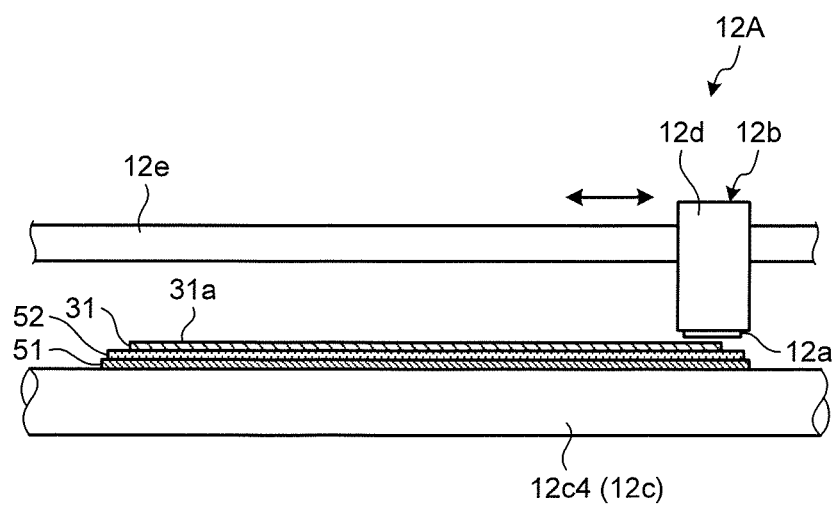
FIG. 20 is an exemplary front view schematically illustrating a general configuration of a part of an ink jet printing device comprised in the apparatus for manufacturing the wiring board, in the fifth embodiment.

In the present embodiment, as one example, in the second section 12, an ink jet printing device 12A (application device, film forming device) illustrated in FIG. 20 is installed. The ink jet printing device 12A comprises, for example, a head 12*a* (discharging portion, injecting portion), a moving device 12*b* (transfer mechanism), a conveyance device 12*c*, and the like. The head 12*a* is attached to a slider 12*d* of the moving device 12*b*. The slider 12*d* can be moved along a rail 12*e* of the moving device 12*b* in parallel with the surface 31*a* of the conductor layer 31. The head 12*a* discharges (injects) the medium at a timing controlled by a controller (not illustrated in the drawings) while being moved by the moving device 12*b*. Furthermore, the conductor layer 31 is conveyed by the conveyance device 12*c* (conveyance roller 12*c*4 or the like, for example) in a state that the conductor layer 31 is stacked on the pallet 51. The direction of moving the head 12*a* in the moving device 12*b* intersects with ("is orthogonal to" in the present embodiment, for example) the direction of moving the conductor layer 31 on the conveyance device 12*c*. The controller controls a timing at which the medium is discharged from the head 12*a* and operations of the moving device 12*b* and the conveyance device 12*c* so that a predetermined pattern of the medium is formed on the surface 31*a*. In this manner, the ink jet printing device 12A applies the medium (insulator 33L or the like, ink) to the surface 31*a* in the predetermined pattern.

In the present embodiment, as one example, in the third section 13, a placing device 13A (see FIG. 18) is installed. The placing device 13A comprises, for example, a stage (placement portion not illustrated) on which the pallet 51 is placed, a conveying device (loading device not illustrated) that conveys an object to be placed, or the like. In the placing device 13A, the conductor layer 34 is placed on the conductor layer 31 on which the conductor layer 32 and the insulating layer 33 are provided. Due to such configuration, as illustrated in FIG. 13, the conductor layer 32 and the insulating layer 33 are covered with the conductor layer 34 from the surface sides thereof opposite the conductor layer 31. That is, the conductor layer 32 and the insulating layer 33 are sandwiched between the conductor layer 31 and the conductor layer 34. An object to be placed on the conductor layer 32 and the insulating layer 33 (conductor layer 34, for example) can be placed by the conveying device or by an operator's manual operation.

In the present embodiment, as one example, in the fourth section 14, a pressing device 14A (press machine, see FIG. 14) is provided. The pressing device 14A comprises, for example, the press 14*a*, heaters 14*b* (heating portions), or the like. The press 14*a* comprises a pair of (parallel) surfaces 14*c* that face to each other. The structure 35 that is placed on the pallet 51 and the cushion material 52 is sandwiched between the surfaces 14*c* of the press 14*a* in a state that the structure 35 is covered with the cushion materials 52. That is, the structure 35 is sandwiched by the press 14*a* by way of the cushion materials 52. The press 14*a* comprises the heaters 14*b*. Due to such configuration, the pressing device 14A pressurizes (presses) the structure 35 by the press 14*a* while heating the structure 35 by the heaters 14*b*. In such a manner, the structure 40 such that the conductor layers 31, 32, and 34 and the insulating layer 33 are integrally formed can be obtained. Here, in the pressing device 14A, as one example, a plurality of structures 40 can be obtained by pressurizing a plurality of structures 35 stacked. Furthermore, in the pressing device 14A, as one example, the thickness of the cushion material 52 is varied depending on a position at which the structure 35 is placed, thus changing the thickness of the structure 40. That is, the thickness of the structure 40 sandwiched between the cushion materials 52 having large thicknesses is reduced (the structure 40 is reduced in height), and the thickness of the structure 40 sandwiched between the cushion materials 52 having small thicknesses is increased (the structure 40 is increased in height). When the structure 35 is pressurized by the pressing device 14A (S4), the conductor layers 31 and 34 are higher in hardness than the conductor layer 32 (conductor 32L) and the insulating layer 33 (insulator 33L) and hence, the thickness of the conductor layer 32 or the insulating layer 33 can locally be varied.

In the present embodiment, as one example, in the fifth section 15, there is provided a conductor pattern forming device 15A that provides the conductor pattern 36 on the structure 40 obtained in the fourth section 14 by performing, for example, mask etching or the like. Furthermore, as one example, in the sixth section 16, there is provided an outer layer forming device 16A that provides the insulating layer 37 (outer layer, third insulating layer, see FIGS. 16, 17), the reinforcing member, or the like on both sides of a structure on which the conductor pattern 36 is formed by bonding, for example, with an adhesive 39 in the fifth section 15. Furthermore, as one example, in the seventh section 17, there is provided a surface treatment device 17A that applies a surface treatment to the exposed conductor portions of a structure on which the insulating layer 37, the reinforcing member, or the like is formed in the sixth section 16. Furthermore, as one example, in the eighth section 18, there is provided an outline machining device 18A that machines a structure to which the surface treatment is applied in the seventh section 17 to obtain the flexible printed wiring board 38.

Furthermore, in the present embodiment, as one example, there is a conveyance device 19 comprising a rail 19*a*, a slider 19*b*, a rotational support 19*c*, an arm 19*d*, and a support 19*e*. In the manufacturing apparatus 1A according to the present embodiment, as one example, a row of the first section 11 to the fourth section 14 and a row of the fifth section 15 to the eighth section 18 are collaterally provided (in parallel with each other, as one example in the present embodiment) in a spaced-apart manner. The conveyance device 19 is positioned between the rows (spaced apart from the rows). The rail 19*a* is extended in parallel with the row of the first section 11 to the fourth section 14 and the row of the fifth section 15 to the eighth section 18, and along the rows. The slider 19*b* is moved along the rail 19*a*. The rotational support 19*c* supports the arm 19*d* and the support 19*e* in a rotatable manner relative to the slider 19*b*. The arm 19*d* moves the support 19*e* between a position inside of each of the sections 11 to 18 and a position on the rail 19*a* side outside each of the sections 11 to 18. The support 19e supports the pallet 51. Due to such configuration, the conveyance device 19 can transfer (moves) the pallet 51 (and the in-process or finished structure placed on the pallet 51) between the respective sections 11 to 18.

According to the present embodiment described above, as one example, the conductor 32L and the insulator 33L are applied (printed) to the conductor layer 31 in a state in which the conductor 32L and the insulator 33L have fluidity and hence, the conductor layer 32 and the insulating layer 33 can be provided on the conductor layer 31. Consequently, according to the present embodiment, as one example, the characteristics of the conductor layer 32 and the insulating layer 33 are easily adjusted. To be more specific, the conductor layer 32 and the insulating layer 33 can easily be varied in size (thickness, height, volume, or the like, for example) depending on the position in the flexible printed wiring board 38, and the conductor layer 32 and the insulating layer 33 can easily be varied in physical property (hardness, modulus of elasticity, electrical conductivity, or the like, for example) depending on the position in the flexible printed wiring board 38. The conductor layer 32 and the insulating layer 33 can have, for example, varied thicknesses (heights) by applying the conductor 32L and the insulator 33L a plurality of times to the surface 31a of the conductor layer 31. That is, the size of the conductor layer 32 or the insulating layer 33 in the portion (area) to which the conductor 32L or the insulator 33L is applied a plurality of times or applied many times is larger than that of the conductor layer 32 or the insulating layer 33 in the portion (area) to which the conductor 32L or the insulator 33L is applied only one time or applied a few times. Here, the conductor layer 32 and the insulating layer 33 are applied to the conductor layer 31 and, thereafter, are heated or dried by a heater or a dryer, which is not illustrated in the drawings, thus being solidified partially or restrictively. Furthermore, the conductor layer 32 or the insulating layer 33 can have, for example, varied thicknesses (heights) by controlling a discharge rate or a injection quantity (flow rate) of the conductor 32L or the insulator 33L with fluidity from the nozzle 11b or the head 12a. Furthermore, the conductor layer 32 or the insulating layer 33 can be, for example, varied in physical property by using the nozzles 11b or the heads 12a.

Furthermore, as described above, the insulating layer 33 has a locally varied thickness (height) thus providing, for example, a portion (area) thinner than the other portion (area) locally in the insulating layer 33. The thin portion of the insulating layer 33 is bent easier than the other portion thereof. Therefore, as one example, the insulating layer 33 can be provided thinly at the portion to be bent in the flexible printed wiring board 38. Furthermore, as described above, the insulating layer 33 has a locally varied thickness (height) thus providing, for example, a portion (area) thicker than the other portion (area) locally in the insulating layer 33. The thick portion of the insulating layer 33 is hardly bent compared to the other portion thereof. Therefore, as one example, in the flexible printed wiring board 38 having a portion connected to a connector (not illustrated in the drawings), a portion having a terminal mounted thereon, or the like that requires higher rigidity or strength, the insulating layer 33 can be formed thick at the portion described above. Accordingly, as one example, there may also be a case that the reinforcing member can be omitted.

Furthermore, in the present embodiment, as one example, the insulator 33L with higher insulation property (lower dielectric constant and dielectric dissipation factor) can be used for (applied to) portions (areas) of the insulating layer 33 that are overlapped with the conductor patterns 36 of the conductor layers 31 and 34, and the insulator 33L with lower insulation property (higher dielectric constant and dielectric dissipation factor) can be used for (applied to) a portion of the insulating layer 33 that is not overlapped with the conductor patterns 36 of the conductor layers 31 and 34. Due to such configuration, as one example, it is possible to obtain the flexible printed wiring board 38 such that the conductor patterns 36 of the conductor layers 31 and 34 are locally covered (paved) with the insulating layer 33 having higher insulation property. The insulator 33L can be varied in insulation property depending on the component (content of filler, for example) of the insulator 33L. There exists the case that the insulating layer 33 with high insulation property has hardness higher than that of the insulating layer 33 with low insulation property. In this case, the above-mentioned constitution facilitates both of improvement of signal transmission characteristics in the conductor pattern 36 of the flexible printed wiring board 38 and improvement of flexibility of the flexible printed wiring board 38.

Furthermore, in the present embodiment, as one example, the insulator 33L with higher insulation property (lower dielectric constant and dielectric dissipation factor) can be used for (applied to) portions (areas) of the insulating layer 33 that require higher heat dissipation characteristics (heat conduction characteristics), and the insulator 33L with lower insulation property (higher dielectric constant and dielectric dissipation factor) can be used for (applied to) the other portion (area) of the insulating layer 33. Due to such configuration, as one example, it is possible to obtain the flexible printed wiring board 38 comprising the insulating layer 33 with high heat dissipating portions (areas) locally.

Here, as one example, the present embodiment exemplifies the case of the flexible printed wiring board 38 with the conductor patterns 36 provided on both surfaces thereof (so-called both-sided board). However, also in a case in which the flexible printed wiring board not illustrated is provided with the conductor pattern 36 on one surface of the flexible printed wiring board, it is possible to obtain the same advantageous effects as that of the above-mentioned configuration of the insulating layer 33. Furthermore, in the present embodiment, as one example, the manufacturing apparatus 1A can manufacture further multilayered flexible printed wiring board (not illustrated) and manufacture a rigid board (printed wiring board, circuit board). Furthermore, in the manufacturing apparatus 1A, in addition to the above-mentioned sections 11 to 18, a section (not illustrated in the drawings) for locally or restrictively curing the conductor 32L or the insulator 33L with fluidity that is applied to the conductor layer 31 can be installed. In this case, the section for curing is, for example, constituted as a chamber having a heated high-temperature atmosphere.

Figure 21:
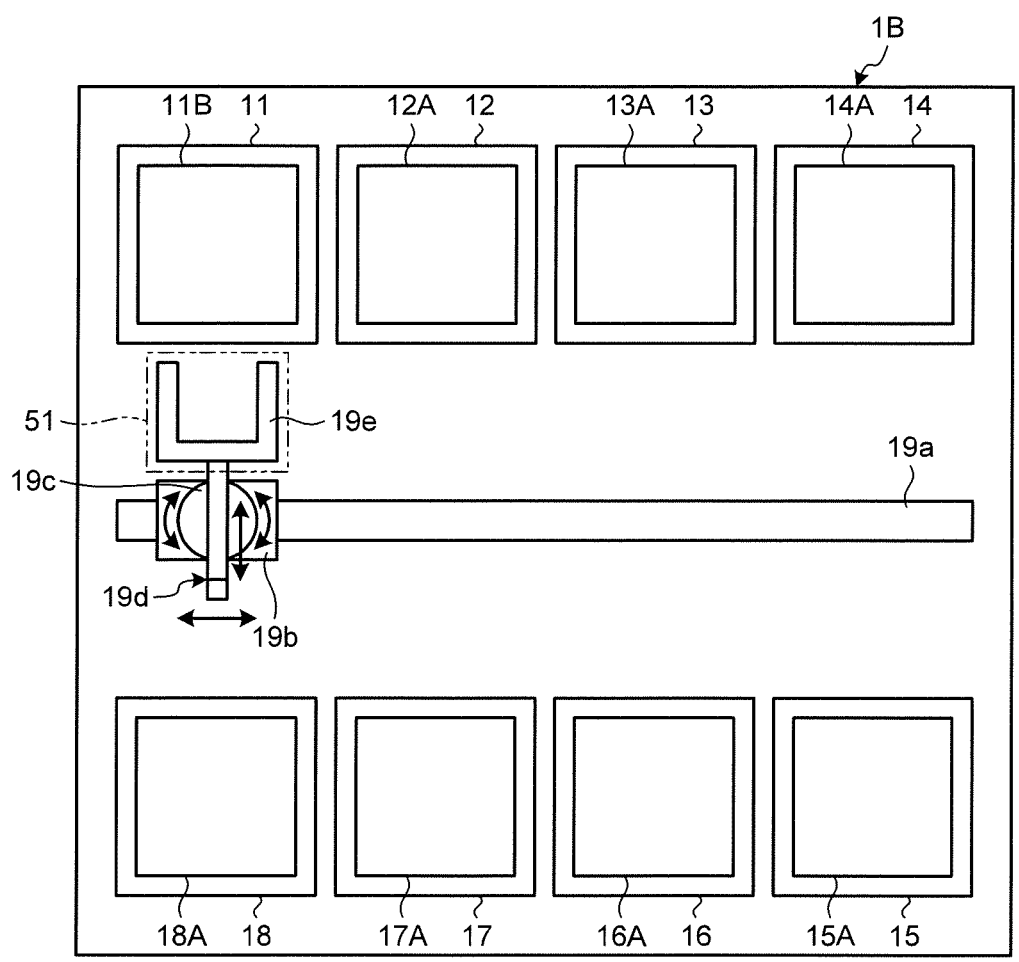
FIG. 21 is an exemplary plan view schematically illustrating a general configuration of an apparatus for manufacturing a wiring board according to a sixth embodiment.

In a sixth embodiment also, in the same manner as the above-mentioned fifth embodiment, the flexible printed wiring board 38 (wiring board) is manufactured in accordance with the procedures in the flowchart illustrated in FIG. 8. However, in the present embodiment, as one example, as illustrated in FIG. 21, the configuration of a manufacturing apparatus 1B differs from that of the manufacturing apparatus 1A in the above-mentioned fifth embodiment. To be more specific, as illustrated in FIG. 21, in the first section 11, an ink jet printing device 11B (application device, film forming device) is provided. The constitution of the inkjet printing device 11B is substantially same as that of the ink jet printing device 12A (see FIG. 20) installed in the second section 12 of the manufacturing apparatus 1A in the fifth embodiment. Accordingly, in the present embodiment, detailed explanation of the ink jet printing device 11B is omitted.

The manufacturing apparatus 1B in the present embodiment is substantially same as the manufacturing apparatus 1A except for the configuration that the ink jet printing device 11B is provided in place of the screen printing device 11A in the first section 11. Accordingly, in the manufacturing apparatus 1B in the present embodiment also, it is possible to provide the conductor layer 32 and the insulating layer 33 by applying (printing) the conductor 32L and the insulator 33L to the conductor layer 31. Accordingly, in the present embodiment also, in the same manner as the above-mentioned fifth embodiment, as one example, the characteristics of the conductor layer 32 and the insulating layer 33 are easily adjusted. To be more specific, the conductor layer 32 and the insulating layer 33 can easily be varied in size (thickness, height, volume, or the like, for example) depending on the position in the flexible printed wiring board 38, and the conductor layer 32 and the insulating layer 33 can easily be varied in physical property (hardness, modulus of elasticity, electrical conductivity, or the like, for example) depending on the position in the flexible printed wiring board 38.

Figure 22:
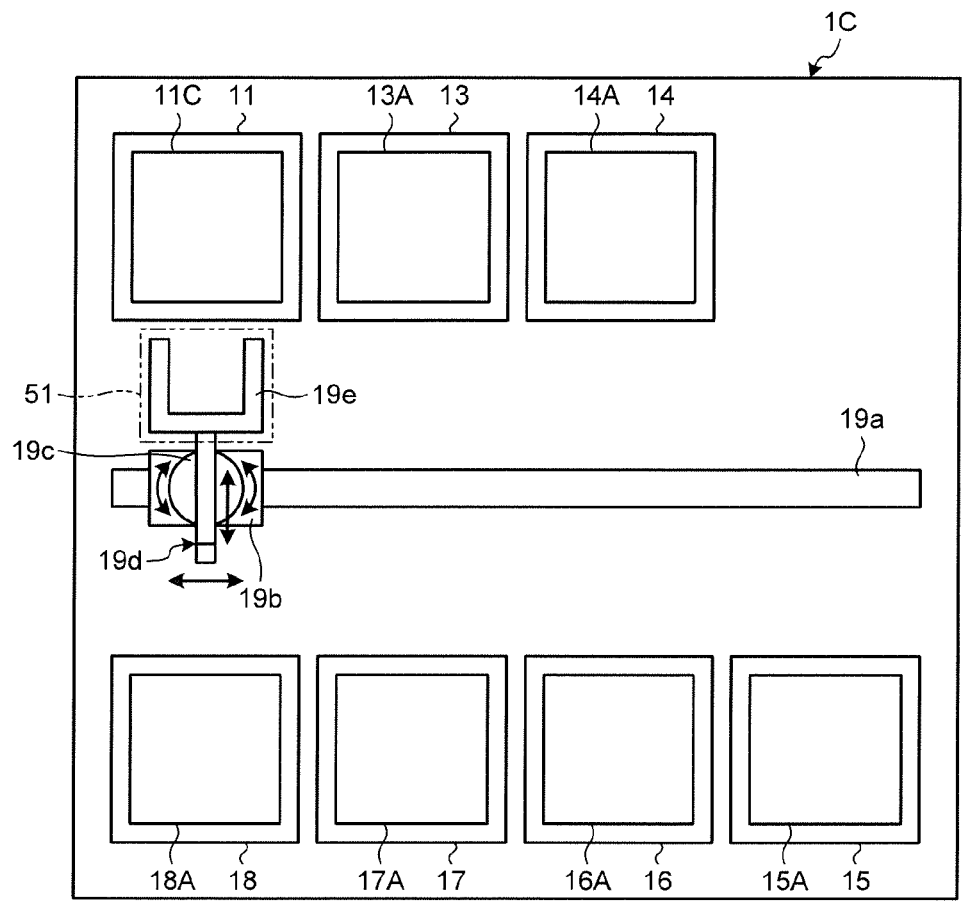
FIG. 22 is an exemplary plan view schematically illustrating a general configuration of an apparatus for manufacturing a wiring board according to a seventh embodiment.
Figure 23:
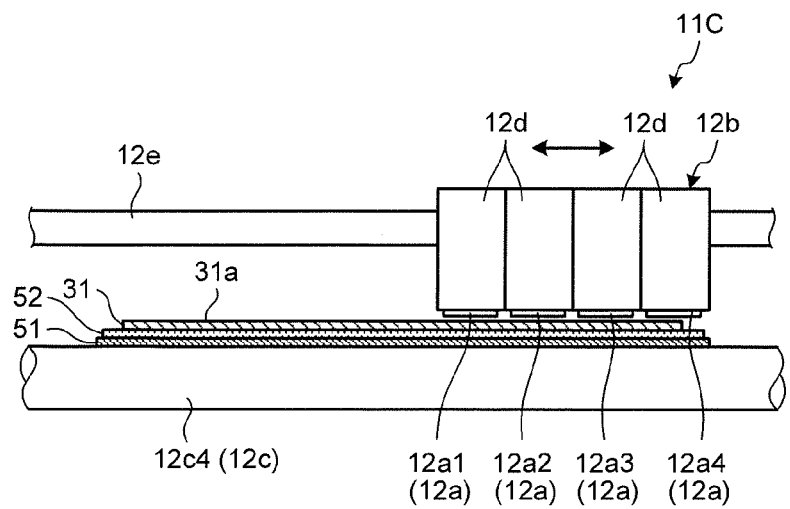
FIG. 23 is an exemplary front view schematically illustrating a general configuration of a part of an ink jet printing device comprised in the apparatus for manufacturing the wiring board, in the seventh embodiment.

In a seventh embodiment also, in the same manner as the above-mentioned fifth and sixth embodiments, the flexible printed wiring board 38 (wiring board) is manufactured in accordance with the procedures in the flowchart illustrated in FIG. 8. However, in the present embodiment, as one example, as illustrated in FIG. 22, the configuration of a manufacturing apparatus 1C differs from that of the manufacturing apparatus 1A in the above-mentioned fifth embodiment and the manufacturing apparatus 1B in the above-mentioned sixth embodiment. To be more specific, as illustrated in FIG. 22, the first section 11 is integrated with the second section 12 and, in the integrated first section 11, an ink jet printing device 11C (application device, film forming device) is provided. The ink jet printing device 11C comprises, as one example, as illustrated in FIG. 23, the head 12a (discharging portion, injecting portion), the moving device 12b (transfer mechanism), the conveyance device 12c, and the like. However, in the present embodiment, the head 12a of the ink jet printing device 11C comprises a head 12a1 (first application module) that applies the conductor 32L in a state in which the conductor 32L has fluidity and a head 12a2 (second application module) that applies the insulator 33L in a state in which the insulator 33L has fluidity. Furthermore, the manufacturing apparatus 1C operates the moving device 12b or the conveyance device 12c to change the relative position of the head 12a and the conductor layer 31 and, at the same time, the conductor 32L and the insulator 33L with fluidity are applied (injected, printed) to the surface 31a of the conductor layer 31 using the head 12a1 and the head 12a2 thus forming the conductor layer 32 and the insulating layer 33.

In the manufacturing apparatus 1C according to the present embodiment also, it is possible to provide the conductor layer 32 and the insulating layer 33 by applying the conductor 32L and the insulator 33L to the conductor layer 31. Accordingly, in the present embodiment also, in the same manner as the above-mentioned fifth and sixth embodiments, as one example, the characteristics of the conductor layer 32 and the insulating layer 33 are easily adjusted. To be more specific, the conductor layer 32 and the insulating layer 33 can easily be varied in size (thickness, height, volume, or the like, for example) depending on the position in the flexible printed wiring board 38, and the conductor layer 32 and the insulating layer 33 can easily be varied in physical property (hardness, modulus of elasticity, electrical conductivity, or the like, for example) depending on the position in the flexible printed wiring board 38. Furthermore, according to the present embodiment, the conductor layer 32 and the insulating layer 33 can simultaneously be provided. Consequently, according to the present embodiment, as one example, the time required to manufacture the flexible printed wiring board 38 is reduced easier compared to the case that the conductor layer 32 and the insulating layer 33 are separately provided.

Furthermore, in the manufacturing apparatus 1C according to the present embodiment, as one example, different media (the conductors 32L and the insulators 33L differing from each other in characteristics, physical properties, constituent, or the like) can be applied from each of a plurality of heads 12a (12a1 to 12a4). Accordingly, in the manufacturing apparatus 1C according to the present embodiment, as one example, the conductor layer 32 or the insulating layer 33 with characteristics, physical properties, constituents, or the like locally different from each other can be provided, and the conductor layers 32 or the insulating layer 33 with characteristics, physical properties, constituents, or the like different from each other can be provided. Accordingly, the flexible printed wiring board 38 with higher performance can be obtained easier.

Figure 24:
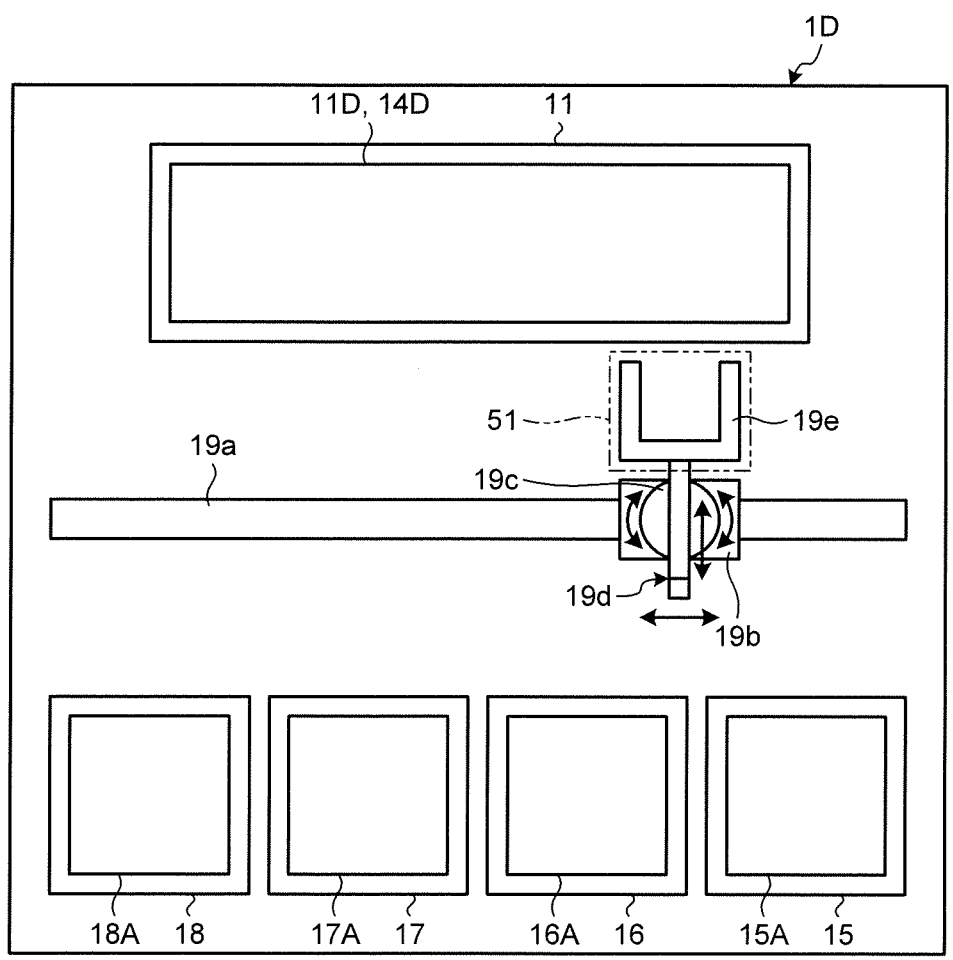
FIG. 24 is an exemplary plan view schematically illustrating a general configuration of an apparatus for manufacturing a wiring board according to an eighth embodiment.

In an eight embodiment also, in the same manner as the above-mentioned first to seventh embodiments, the flexible printed wiring board 38 (wiring board) is manufactured in accordance with the procedures in the flowchart illustrated in FIG. 8. However, in the present embodiment, as one example, as illustrated in FIG. 24, the configuration of a manufacturing apparatus 1D differs from that of the manufacturing apparatus 1A, 1B, or 1C in the above-mentioned first to seventh embodiments. To be more specific, as illustrated in FIG. 24, the first section 11 is integrated with the second to fourth sections 12 to 14 and, in the integrated first section 11, an ink jet printing device 11D (application device, film forming device) and a pressing device 14D (press machine) is installed. The ink jet printing device 11D and the pressing device 14D have, as one example, as illustrated in FIG. 25, the head 12a (discharging portion, injecting portion), the moving device 12b (transfer mechanism), the conveyance device 12c, and the like. The pressing device 14D comprises a pair of pressing rollers 14d. The conveyance device 12c comprises feed rollers 12c1 and 12c2 (feeding portion), a winding roller 12c3 (winding portion, collecting module), the conveyance rollers 12c4 (carrying portion, guide portion). The feed rollers 12c1 and 12c2 respectively have strip-shaped bodies 41a and 41b wound therearound. The strip-shaped bodies 41a and 41b are respectively fed (pulled out) from the feed rollers 12c1 and 12c2, moved while being guided by the carrying rollers 12c4, overlapped in the middle of the conveyance device 12c, and sandwiched between a pair of the pressing rollers 14d arranged collaterally (in parallel with each other) so as to be pressed. Thereafter, the strip-shaped bodies 41a and 41b are wound around (collected on) the winding roller 12c3. The conductor layer 31 is placed on the strip-shaped body 41a fed from the feed roller 12c1 by way of the cushion material 52. The conductor layer 32 and the insulating layer 33 are provided on the conductor layer 31 with the use of the ink jet printing device 11D. The strip-shaped body 41a and the strip-shaped body 41b are overlapped with each other on the downstream side of the ink jet printing device 11D. The conductor layer 34 (see FIG. 13) is placed on the side closer to the conductor layer 32 and the insulating layer 33 of the strip-shaped body 41b that is brought into overlap with the conductor layer 32 and the insulating layer 33. Accordingly, the strip-shaped bodies 41a and 41b are overlapped with each other on the downstream side of the ink jet printing device 11D thus obtaining the structure 35 (layered body, internal structure, see FIG. 13) such that the conductor layer 32 and the insulating layer 33 are sandwiched between the conductor layer 31 and the conductor layer 34. A number of the structures 35 are aligned along the strip-shaped bodies 41a and 41b while being sandwiched between the strip-shaped bodies 41a and 41b and sequentially pressed by a pair of the pressing rollers 14d. The structures 35 are wound around the winding roller 12c3 and also pressed in the diameter direction (in the overlapping direction) of the winding roller 12c3 while being sandwiched between the strip-shaped bodies 41a and 41b on the winding roller 12c3. Each structure 35 is pressed in the pressing rollers 14d and the winding roller 12c3 thus obtaining the structure 40 (see FIG. 14) such that the conductor layers 31, 32, and 34 and the insulating layer 33 are integrally formed. Furthermore, in the pressing rollers 14d or the winding roller 12c3, a heater 42 for curing the insulating layer 33 is installed as required. The heater 42 can be, for example, constituted as a hot air blower.

Furthermore, in the present embodiment also, the ink jet printing device 11D comprises the head 12a comprising the head 12a1 that applies the conductor 32L in a state in which the conductor 32L has fluidity and the head 12a2 that applies the insulator 33L in a state in which the insulator has fluidity (see FIG. 23). Furthermore, the manufacturing apparatus 1D operates the moving device 12b or the conveyance device 12c to change the relative position of the head 12a and the conductor layer 31 and, at the same time, applies (injected, printed) the conductor 32L and the insulator 33L to the surface 31a of the conductor layer 31 from the head 12a1 and the head 12a2 in a state in which the conductor 32L and the insulator 33L has fluidity, thus providing the conductor layer 32 and the insulating layer 33.

In the manufacturing apparatus 1D according to the present embodiment also, it is possible to provide the conductor layer 32 and the insulating layer 33 by applying (printing) the conductor 32L and the insulator 33L to the conductor layer 31. Accordingly, in the present embodiment also, in the same manner as the above-mentioned first to seventh embodiments, as one example, the characteristics of the conductor layer 32 and the insulating layer 33 are easily adjusted. To be more specific, the conductor layer 32 and the insulating layer 33 can easily be varied in size (thickness, height, volume, or the like, for example) depending on the position in the flexible printed wiring board 38, and the conductor layer 32 and the insulating layer 33 can easily be varied in physical property (hardness, modulus of elasticity, electrical conductivity, or the like, for example) depending on the position in the flexible printed wiring board 38. Furthermore, in the present embodiment, the conductor layer 32 and the insulating layer 33 can simultaneously be provided. Furthermore, according to the present embodiment, the processing of S11 to S14 can be performed as a series of processes in the integrated first section 11 by making use of the strip-shaped bodies 41a and 41b. Accordingly, in the present embodiment, as one example, the time required to manufacture the flexible printed wiring board 38 is reduced easier.

Although the embodiments are explained heretofore, each of the above-mentioned embodiments merely constitutes one example, and various modifications are arbitrarily conceivable. For example, the number of the sections or the devices can further be increased and also decreased. Furthermore, the specifications (structure, direction, shape, size, length, width, thickness, height, number, arrangement, position, material, or the like) of the devices, the first application module, the second application module, the strip-shaped body, the pallet, the conveying device, the conductor layer, the insulating layer, the flexible printed wiring board, the wiring board, the application device, or the like can optionally be changed to achieve the object of the embodiments.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An apparatus for manufacturing a flexible printed wiring board, the apparatus comprising:
   a device configured to selectively provide a second conductor layer on a surface of a first conductor layer by selectively applying an electrically conductive paste onto the surface of the first conductor layer by screen printing or ink jet printing;
   a device configured to selectively provide a first insulating layer on the surface of the first conductor layer by selectively applying an insulating resin onto the surface of the first conductor layer by screen printing or ink jet printing, such that the second conductor layer and the first insulating layer are applied to different portions of the first conductor layer, the second conductor layer having a greater height than the first insulating layer;
   a device configured to integrate the first conductor layer, the second conductor layer, the first insulating layer, and a third conductor layer, in a state in which the second conductor layer and the first insulating layer provided on the surface of the first conductor layer are covered with the third conductor layer from a side opposite the first conductor layer by pressing and heating in a state in which the second conductor layer and the first insulating layer provided on the surface of the first conductor layer are covered with the third conductor layer from the side opposite the first conductor layer and in which the first conductor layer and the third conductor layer are sandwiched between presses;
   a device configured to form a conductor pattern by selectively removing at least one of the first conductor layer and the third conductor layer in a structure obtained by integrating the first conductor layer, the second conductor layer, the first insulating layer, and the third conductor layer;
   a device configured to cover both sides of the structure in which the conductor pattern is formed with second insulating layers; and
   a device configured to sandwich the structure in a thickness direction of the structure via cushion materials and press the structure in the thickness direction, wherein
   the first conductor layer and the third conductor layer have a greater hardness than the second conductor layer and the first insulating layer, and
   the device configured to press the structure sandwiches the structure to different thicknesses depending on a position in the structure, by varying a thickness of the cushion materials at different positions in the cushion materials.

2. The apparatus for manufacturing a flexible printed wiring board of claim 1, wherein
the device configured to selectively provide the second conductor layer comprises a first ink jet printing device configured to apply the electrically conductive paste to the surface of the first conductor layer by selectively applying the electrically conductive paste to the surface of the first conductor layer in a state in which the electrically conductive paste has fluidity,
the device configured to selectively provide the first insulating layer comprises a second ink jet printing device configured to apply the insulating resin to the surface of the first conductor layer by selectively applying the insulating resin to the surface of the first conductor layer in a state in which the insulating resin has fluidity, and
the first ink jet printing device and the second ink jet printing device simultaneously apply the electrically conductive paste and the insulating resin, respectively, onto the surface of the first conductor layer.

3. The apparatus for manufacturing a flexible printed wiring board of claim 1, wherein the device configured to provide the second conductor layer provides the second conductor layer on the surface before the device configured to provide the first insulating layer provides the first insulating layer on the surface.

4. The apparatus for manufacturing a flexible printed wiring board of claim 1, wherein the device configured to integrate the first conductor layer, the second conductor layer, the first insulating layer, and the third conductor layer provides the structure on a strip-shaped body.

5. The apparatus for manufacturing a flexible printed wiring board of claim 1, further comprising a conveying device configured to convey a pallet between the devices, the first conductor layer being placed on the pallet.

6. The apparatus for manufacturing a flexible printed wiring board of claim 1, wherein the device configured to provide the second conductor layer provides a plurality of the second conductor layers with physical properties different from each other on the surface.

7. The apparatus for manufacturing a flexible printed wiring board of claim 1, wherein the device configured to provide the first insulating layer provides a plurality of the first insulating layers with physical properties different from each other on the surface.

8. The apparatus for manufacturing a flexible printed wiring board of claim 1, wherein the device configured to provide the first insulating layer provides a plurality of the first insulating layers with heights different from each other on the surface.

* * * * *